United States Patent
Yamada et al.

(10) Patent No.: US 9,048,250 B2
(45) Date of Patent: Jun. 2, 2015

(54) METHOD OF MANUFACTURING A SUPER-JUNCTION SEMICONDUCTOR DEVICE

(71) Applicant: FUJI ELECTRIC CO., LTD., Kawasaki-shi (JP)

(72) Inventors: Michiya Yamada, Hino (JP); Tatsuhiko Fujihira, Matsumoto (JP)

(73) Assignee: FUJI ELECTRIC CO., LTD. (JP)

( * ) Notice: Subject to any disclaimer, the term of this patent is extended or adjusted under 35 U.S.C. 154(b) by 0 days.

(21) Appl. No.: 14/182,906

(22) Filed: Feb. 18, 2014

(65) Prior Publication Data

US 2014/0242769 A1 Aug. 28, 2014

(30) Foreign Application Priority Data

Feb. 25, 2013 (JP) ................................. 2013-034487

(51) Int. Cl.
*H01L 21/336* (2006.01)
*H01L 29/66* (2006.01)
*H01L 21/263* (2006.01)

(52) U.S. Cl.
CPC ........ *H01L 29/66477* (2013.01); *H01L 21/263* (2013.01)

(58) Field of Classification Search
USPC .................... 257/139, 329; 438/518, 527, 289
See application file for complete search history.

(56) References Cited

U.S. PATENT DOCUMENTS

| | | | |
|---|---|---|---|
| 5,216,275 | A | 6/1993 | Chen |
| 2003/0148559 | A1 | 8/2003 | Onishi et al. |
| 2011/0147829 | A1 | 6/2011 | Nakajima |
| 2012/0169262 | A1 | 7/2012 | Nakajima |
| 2013/0026560 | A1 | 1/2013 | Onishi et al. |
| 2013/0082323 | A1* | 4/2013 | Xiao ............................ 257/329 |

FOREIGN PATENT DOCUMENTS

| | | |
|---|---|---|
| JP | 2001-119022 A | 4/2001 |
| JP | 2007-235080 A | 9/2007 |
| JP | 2012-142330 A | 7/2012 |
| WO | 2010024433 A1 | 3/2010 |
| WO | 2011/093473 A1 | 8/2011 |

* cited by examiner

*Primary Examiner* — Errol Fernandes
(74) *Attorney, Agent, or Firm* — Rossi, Kimms & McDowell LLP

(57) ABSTRACT

A method of manufacturing a super-junction semiconductor device is disclosed that allows forming a high concentration layer with high precision and improves the trade-off relationship between the Eoff and the dV/dt. The method comprises a step of forming a parallel pn layer and a step of forming a proton irradiated layer in the upper region of the pn layer. Then, heat treatment is conducted on the proton irradiated layer for transforming the protons into donors to form a high concentration n type semiconductor layer.

12 Claims, 19 Drawing Sheets

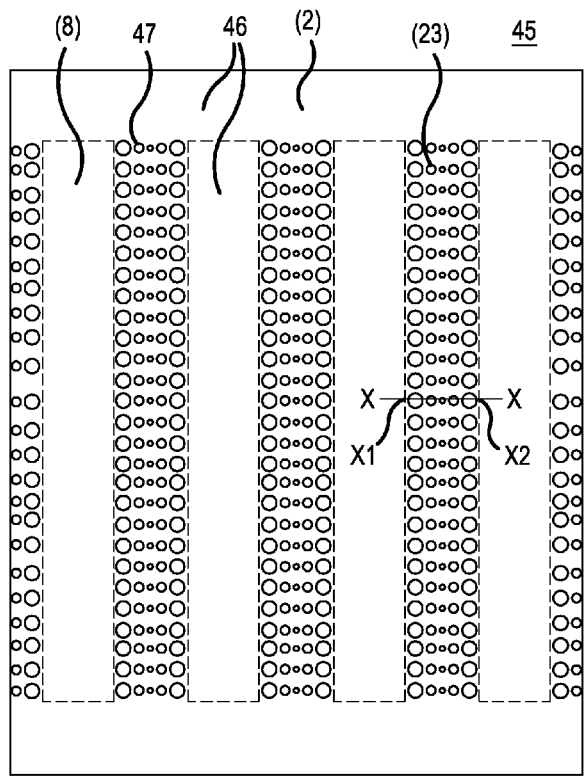
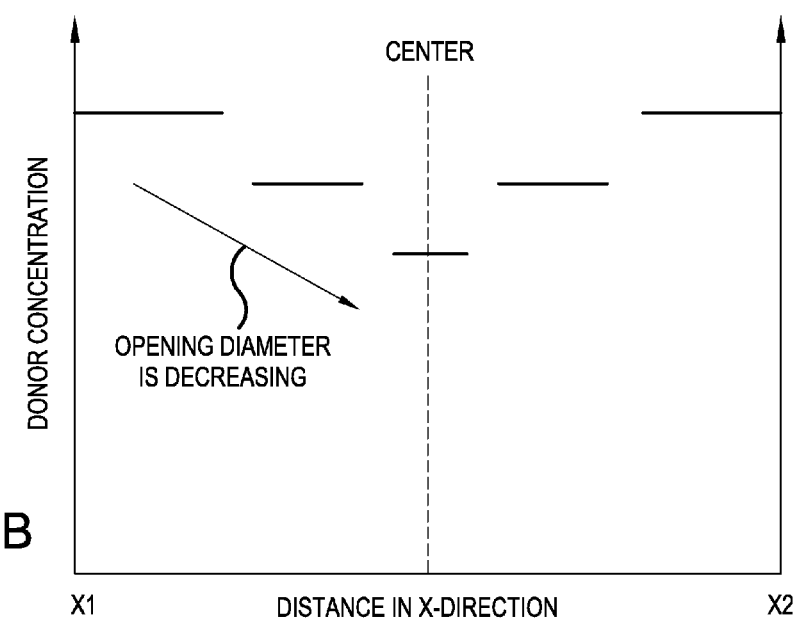
FIG.19A
FIG.19B

US 9,048,250 B2

METHOD OF MANUFACTURING A SUPER-JUNCTION SEMICONDUCTOR DEVICE

This application is based on, and claims priority to, Japanese Patent Application No. 2013-034487, filed on Feb. 25, 2013, contents of which are incorporated herein by reference.

BACKGROUND OF THE INVENTION

A. Field of the Invention

The present invention relates to a method of manufacturing a power semiconductor device such as a MOSFET, and in particular, to a method of manufacturing a super-junction semiconductor device having a super-junction structure (also called a parallel pn column structure), a drift layer which is constructed with n type columns and p type columns extending in a direction perpendicular to a principal surface of a semiconductor substrate and arranged alternately in the direction parallel to the principal surface.

B. Description of the Related Art

The following patent documents will be discussed herein:
Patent Document 1—Japanese Unexamined Patent Appn. Pub. No. 2001-119022
Patent Document 2—U.S. Pat. No. 5,216,275
Patent Document 3—International Patent Appn. Pub. WO2011/093473
Patent Document 4—Japanese Unexamined Patent Appn. Pub. No. 2012-142330
Patent Document 5—International Patent Appn. Pub. WO2010/024433
Patent Document 6—Japanese Unexamined Patent Appn. Pub. No. 2007-235080.

Semiconductor devices are generally classified into horizontal type devices having the electrodes on one side of the semiconductor substrate and vertical type devices having the electrodes on both sides of the semiconductor substrate. In a vertical semiconductor device, the direction of flow of drift current in an ON state coincides with the direction of extension of a depletion layer due to a reverse bias voltage in an OFF state. In a usual planar n channel vertical type MOSFET, a high resistaivity $n^-$ drift layer carries drift current in the vertical direction in an ON state. Consequently, a shortened current path of the $n^-$ drift layer lowers a drift resistance and thus reduces actual ON resistance of a MOSFET.

On the other hand, the high resistivity $n^-$ drift layer is depleted in the OFF state to enhance the withstand voltage. Consequently, a thin $n^-$ drift layer narrows the width of the depletion layer starting from the pn junction between a p base region and the n– drift layer and extending into the region between the drain and base, resulting in lowered withstand voltage. On the contrary, a semiconductor device exhibiting a high withstand voltage has a thick n– drift layer and a high ON resistance, resulting in large conduction loss. Thus, there is a trade-off relationship between the ON resistance and the withstand voltage. This trade-off relationship is known to be likewise held in other semiconductor devices including IGBTs, bipolar transistors, and diodes.

In order to cope with this problem of the trade-off relationship, Patent Documents 1 and 2 disclose super-junction semiconductor devices with the drift layer thereof composed of a parallel pn layer formed of repeated structure of alternately adjoined high concentration n type regions and p type regions.

FIG. 14H is a sectional view of an essential part of a conventional super-junction semiconductor device. Device surface structure 250 formed in a region of a first principal surface, which is a front surface, comprises p base region 225, $p^+$ contact region 223, $n^+$ source region 224, gate electrode 231, insulation film 232, and source electrode 233. In a region of a second principal surface, which is a back surface, drain electrode 211 in contact with $n^+$ drain region 210 is provided. Parallel pn layer 150 is formed between device surface structure 250 and $n^+$ drain region 210.

In super-junction semiconductor device 500 having the structure described above, a depletion layer expands laterally from every pn junction extending vertically in the pn layer in an OFF state. Thus, the whole drift layer is depleted even though the impurity concentration of parallel pn layer 150 is high. Consequently, parallel pn layer 150 achieves a high withstand voltage.

Two major methods are known for manufacturing super-junction semiconductor device 500. Patent Document 1 discloses a method for forming a super-junction by repeating processes of epitaxial growth and ion implantation. This method is called a multi-stage epitaxial method.

FIGS. 13A through 13F and, FIGS. 14G and 14H are sectional views illustrating a conventional method of manufacturing, in a sequence of steps, a super-junction semiconductor device according to a multi-stage epitaxial method.

(1) First, as shown in FIG. 13A, high resistivity semiconductor epitaxial layer 120 is formed on $n^+$ silicon substrate 110.

(2) Then, as shown in FIG. 13B, phosphorus ions 121a are implanted onto a surface of the semiconductor epitaxial layer 120 to form n type implantation region 121.

(3) Then, as shown in FIG. 13C, resist 130 is applied on n type implantation region 121 on the surface of semiconductor epitaxial layer 120 and then patterned by a photolithography method.

(4) Then, as shown in FIG. 13D, boron ions 122a are implanted from the surface side of resist 130 and semiconductor epitaxial layer 120 to form p type implantation layer 122.

(5) Then, as shown in FIG. 13E, resist 130 is removed.

(6) Then, as shown in FIG. 13F, steps (1) through (5) described above are repeated six times, for example, and then semiconductor epitaxial layer 120 is formed once again.

(7) Then, as shown in FIG. 14G, a driving heat treatment process is conducted at a temperature between 1,150° C. and 1,200° C., which is higher than the temperature in the epitaxial growth process. The heat treatment process performs diffusion of phosphorus ions 121a in n type implantation regions 121 and boron ions 122a in p type implantation regions 122, and makes each of n type implantation regions 121 and p type implantation regions 122 join together in the vertical direction, thereby producing n type semiconductor layer 123, i.e., an n type column, and p type semiconductor layer 124, i.e., a p type column. The impurity concentrations in n type semiconductor layer 123 and p type semiconductor layer 124 are higher around dotted lines 140 than those in inner regions 141 between lines 140.

(8) Finally, as shown in FIG. 14H, device surface structure 250 is formed including p base region 225, $p^+$ contact region 223, $n^+$ source region 224, gate electrode 231, oxide film 232, and source electrode 233. Drain electrode 211 is formed on the back surface of $n^+$ drain region 210, which is $n^+$ silicon substrate 110. All these components are formed by processes commonly employed in manufacturing a conventional MOSFETs. Thus, a traditional super-junction semiconductor device 500 is completed.

Patent Document 2 discloses another method of manufacturing a super-junction structure in which an n type layer is epitaxially grown on an $n^+$ substrate and a trench is dug in the n type layer. In the trench, a p type layer is epitaxially grown. This method is called a trench embedding method.

Patent Document 3 discloses a super-junction semiconductor device that improves relationship between Eoff and dV/dt. This super-junction semiconductor device comprises a high concentration layer, for example a high concentration n type semiconductor layer, in the surface region (on the first principal surface side) of the super-junction structure, that contains impurities at a concentration 1.5 to 2.0 times higher than those in the inner portion of the super-junction structure. This construction makes the extension of depletion layer in the turning OFF process difficult without changing an external gate resistance connected to the gate terminal of the super-junction semiconductor device. Thus, the trade-off relationship between the Eoff and dV/dt is improved.

Now an explanation is made on the relationship between the Eoff and the dV/dt in the turning OFF process. In order to suppress electromagnetic noise, a measure is conventionally taken in which a gate resistance, a circuit resistance, with a relatively high resistance is connected to the gate of the super-junction semiconductor device from the outside to reduce the dV/dt in a turning OFF process. An enlarged gate resistance, however, elongates the time for drawing out the charges from a gate capacitance including a mirror capacitance of the super-junction semiconductor device in a turning OFF process, resulting in increased turning OFF loss, i.e., Eoff. Therefore, the Eoff is in a trade-off relationship with the dV/dt. Patent Document 3 discloses a device structure that improves the trade-off relationship between Eoff and dV/dt by decreasing dV/dt without enlarging a gate resistance. In this device structure, a parallel pn layer of super-junction is formed by multi-stage epitaxial method and a high concentration layer is formed at the position of the top stage. Patent Document 3 also discloses another method that forms a high concentration epitaxial layer on a low concentration epitaxial layer. Then, trench embedding method is used for embedding a p type semiconductor layer in a trench to form a super-junction parallel pn layer. This forms a structure having a high concentration epitaxial layer arranged in the top portion of a parallel pn layer.

Patent Document 4 discloses a MISFET (Metal-Insulator-Semiconductor Field-Effect Transistor) provided with a high concentration n type buffer layer under a parallel pn layer in order for reverse recovery current of a parasitic diode to become soft-recoverying. This buffer layer is formed by making heavy particles such as protons or helium ions become donors. These heavy particles also work as lifetime killers.

Patent Document 5 discloses lifetime control by introducing lifetime killers into a parallel pn layer of a super-junction MOSFET, which is carried out by irradiation of heavy particles such as protons or helium ions forming lattice defects. Optimization of the depth of the heavy particle irradiation allows the reverse recovery time of the parasitic diode and the leakage current to become simultaneously small.

Patent Document 6 discloses about forming a parallel pn layer long in the depth direction, which is formed by multiple times of oblique ion implantation onto a side wall of a deep trench with an aspect ratio larger than 8 and then filling the trench with a semiconductor layer of the opposite conductivity type.

However, the multi-stage epitaxial growth method as disclosed in Patent Document 3 repeats about six times, as previously described referring to FIGS. 13A through 13F, a series of four steps of: (1) epitaxial growth, (2) ion implantation, (3) patterning, and (4) ion implantation. This procedure takes a long time and raises manufacturing costs. The trench embedding method is also costly when the high concentration layer with a homogeneous impurity concentration is formed by epitaxial growth process. The epitaxial growth process is difficult to control an impurity concentration and thickness of the high concentration layer with high accuracy.

Patent Document 1 discloses a trade-off relationship between Eoff and dV/dt only about a parasitic diode and fails to mention improvement in the trade-off relationship between Eoff and dV/dt in a turning OFF process in the case of variable gate resistance of a MOSFET. Patent Documents 2, 4, and 6 fail to mention improvement in the trade-off relationship between Eoff and dV/dt in a turning OFF process in the case of variable gate resistance with a parallel pn layer having a high concentration layer disposed in an upper part of the parallel pn layer. The technique of heavy particle irradiation disclosed in Patent Document 5 is for controlling the lifetime and the document does not mention producing donors.

The present invention is directed to overcoming or at least reducing the effects of one or more of the problems set forth above.

SUMMARY OF THE INVENTION

The present invention has been made in view of the foregoing and provides a method of manufacturing a super-junction semiconductor device to improve a relationship between the Eoff and dV/dt by using a technique of embedding in trenches to form high concentration layer with high accuracy.

A method of manufacturing a super-junction semiconductor device of a first aspect of the present invention comprises steps of: forming a first semiconductor layer of a first conductivity type with a lower concentration than a high concentration semiconductor substrate on the semiconductor substrate by means of an epitaxial growth process; forming a trench in the first semiconductor layer from a surface of the first semiconductor layer toward the semiconductor substrate; forming a parallel pn layer of a super-junction structure by filling the trench with an epitaxially grown second semiconductor layer of a second conductivity type; forming a device surface structure on the surface region of the parallel pn layer; decreasing a thickness of the semiconductor substrate by grinding a back side of the semiconductor substrate after the step of forming the device surface structure; forming a heavy particle irradiation layer by irradiating heavy particles from the back side of the semiconductor substrate into a portion of the parallel pn layer beneath the device surface structure after the step of decreasing the thickness of the semiconductor substrate; and forming a third semiconductor layer of the first conductivity type with an impurity concentration lower than that of the second semiconductor layer and higher than that of the first semiconductor layer by transforming the heavy particles in the heavy particle irradiation layer formed by the heavy particle irradiation into donors through a heat treatment process.

The method of manufacturing a super-junction semiconductor device of a second aspect of the present invention is the method of the first aspect of the invention wherein the heavy particle irradiation layer is preferably disposed under the device surface structure in the range of at most a half of the distance from a bottom of the device surface structure to a bottom of the parallel pn layer.

The method of manufacturing a super-junction semiconductor device of a third aspect of the present invention is the method of the second aspect of the invention wherein the heavy particle irradiation layer is preferably disposed under the device surface structure in the range of at most a quarter of the distance from a bottom of the device surface structure to a bottom of the parallel pn layer.

The method of manufacturing a super-junction semiconductor device of a fourth aspect of the present invention is the method of the first aspect of the invention wherein a mean donor concentration of donors that are transformed from the heavy particles in the heavy particle irradiation layer through the heat treatment process is preferably in the range of 0.1 times to 2 times the impurity concentration of the first semiconductor layer.

The method of manufacturing a super-junction semiconductor device of a fifth aspect of the present invention is the method of the first aspect of the invention wherein the heavy particle irradiation layer is preferably formed by conducting multiple times of heavy particle irradiation at different acceleration energies.

The method of manufacturing a super-junction semiconductor device of a sixth aspect of the present invention is the method of the first aspect of the invention wherein the step of forming the device surface structure preferably comprises steps of: forming a fourth semiconductor layer of the second conductivity type in contact with the second semiconductor layer; forming a fifth semiconductor layer of the first conductivity type in a surface region of the fourth semiconductor layer; and forming a gate electrode through a gate insulation film over the fourth semiconductor layer between the fifth semiconductor layer and the first semiconductor layer.

The method of manufacturing a super-junction semiconductor device of a seventh aspect of the present invention is the method of the first aspect of the invention wherein in the step of forming a heavy particle irradiation layer by irradiating heavy particles from the back side of the semiconductor substrate with a decreased thickness into a portion of the parallel pn layer beneath the device surface structure, the heavy particle irradiation is preferably conducted disposing a shielding part of a shielding mask on the second semiconductor layer of the parallel pn layer and disposing openings of the shielding mask on the first semiconductor layer of the parallel pn layer.

The method of manufacturing a super-junction semiconductor device of a eighth aspect of the present invention is the method of the first aspect of the invention wherein the shielding mask is preferably extending onto the first semiconductor layer of the parallel pn layer; a shielding part of the shielding mask is preferably disposed on the second semiconductor layer; and a plurality of openings of the shielding mask are disposed on the first semiconductor layer of the parallel pn layer, the magnitude of the openings gradually decreasing along a direction toward a center of the first semiconductor layer.

The method of manufacturing a super-junction semiconductor device of a ninth aspect of the present invention is the method of any one of the first through eighth aspect of the invention wherein the heavy particle is preferably a proton or a helium ion.

The method of manufacturing a super-junction semiconductor device of a tenth aspect of the present invention is the method of any one of the first through ninth aspect of the invention wherein the super-junction semiconductor device is preferably a super-junction MOSFET.

The present invention as stated above eliminates repeated redundant steps as in the conventional method using a multi-stage of epitaxial growth method and thus, shortens manufacturing steps, resulting in low manufacturing costs.

In addition, enhanced impurity concentration in the surface side of the super-junction parts makes dV/dt smaller and improves the trade-off relationship between the dV/dt and the Eoff, at low manufacturing costs.

Using a heavy particle irradiation technique for forming a high concentration region forms the impurity concentration and thickness in the high concentration region with high accuracy. As a result, the rate of non-defective products is improved, reducing manufacturing costs.

BRIEF DESCRIPTION OF THE DRAWINGS

The foregoing advantages and features of the invention will become apparent upon reference to the following detailed description and the accompanying drawings, of which:

FIG. 19A is a plan view showing an essential part of shielding mask 45; and

FIG. 19B is a graph showing donor distribution along the line X-X in FIG. 19A.

DETAILED DESCRIPTION OF SPECIFIC EMBODIMENTS

The following describes in detail a method of manufacturing a super-junction semiconductor device according to some preferred embodiments of the present invention with reference to the accompanying drawings.

Embodiment Example 1

FIGS. 1 through 9 show a method of Embodiment Example 1 of the present invention for manufacturing super-junction semiconductor device 100 and are sectional views of essential parts presented in the sequence of manufacturing steps. Although the following description of Embodiment Example 1 is made basically about a super-junction MOSFET with a withstand voltage of 600 V class, the present invention can be applied to any devices with other withstand voltage classes by appropriately adjusting film thicknesses, dimensions, and other parameters.

In the following description, a first conductivity type is an n type and a second conductivity type is a p type. However, the conductivity type can be reversed.

Figure 1:
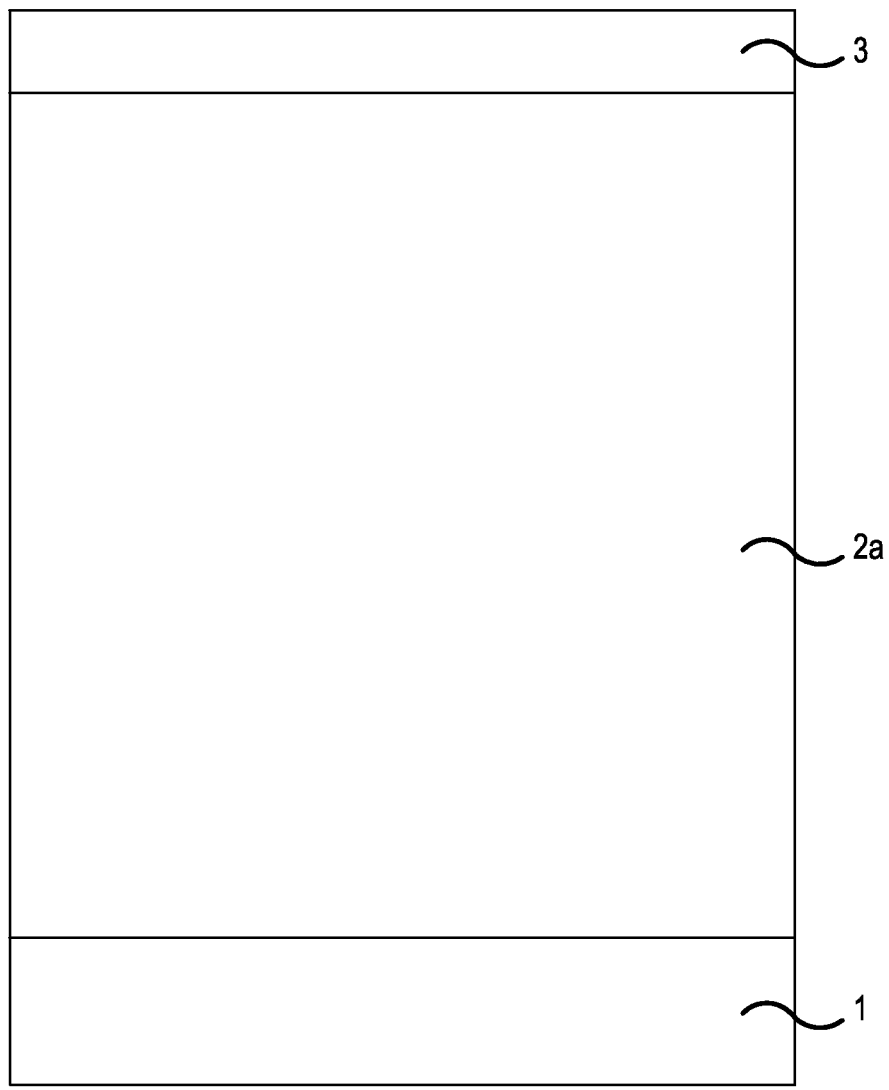
FIG. 1 is a sectional view showing an essential part of super-junction semiconductor device 100 in a step of manufacturing device 100 according to a first embodiment of the invention.

(1) First, as shown in FIG. 1, on n type semiconductor substrate 1 of silicon with a thickness of several hundred microns, n type semiconductor layer 2a with a thickness of about 45 μm is formed by epitaxial growth, and on n type semiconductor layer 2a, oxide film 3 of $SiO_2$ is formed.

Figure 2:
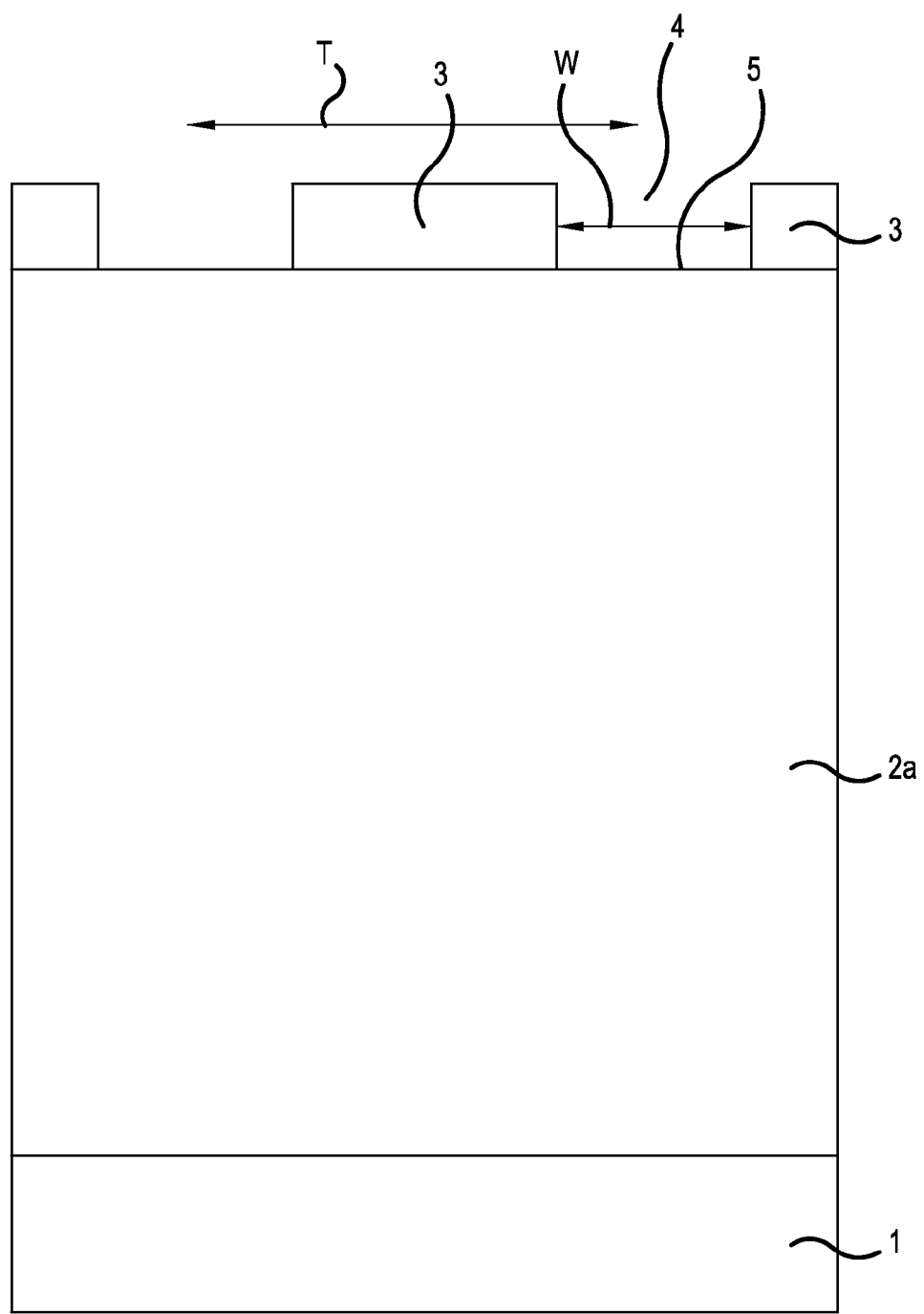
FIG. 2 is a sectional view showing an essential part of super-junction semiconductor device 100 in a step of manufacturing the device 100 according to the first embodiment of the invention following the step of FIG. 1.
Figure 10:
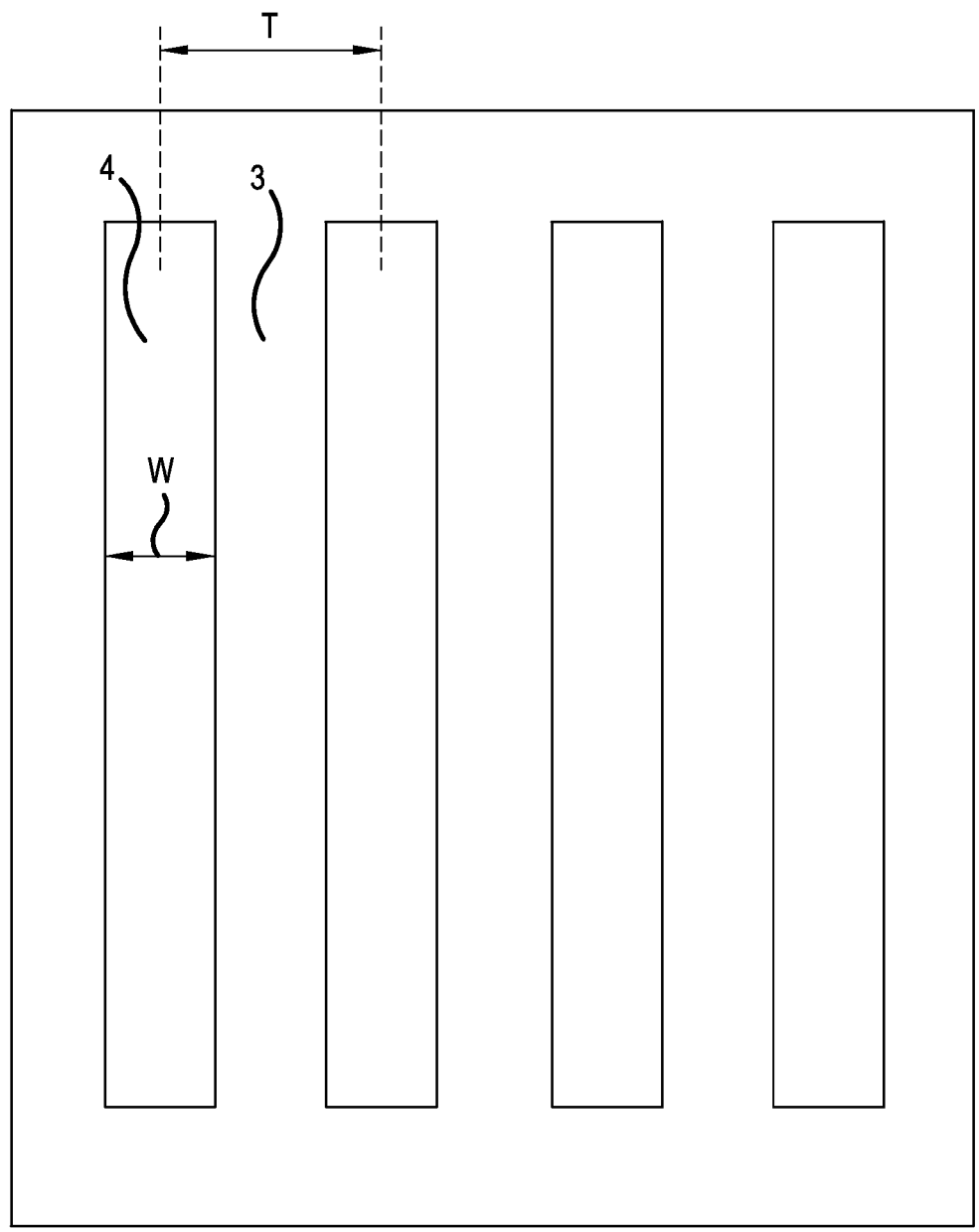
FIG. 10 is a sectional view of an essential part of an oxide film mask with a line and space configuration in which openings of stripe shapes are arranged with a predetermined pitch.

(2) Then, as shown in FIG. 2, oxide film 3 is patterned by a lithography method. FIG. 10 shows a plan view of an example of pattern, which is a stripe of line and space configuration having a width W of opening 4 of 6 μm and a cell pitch T of 12 μm.

Figure 3:
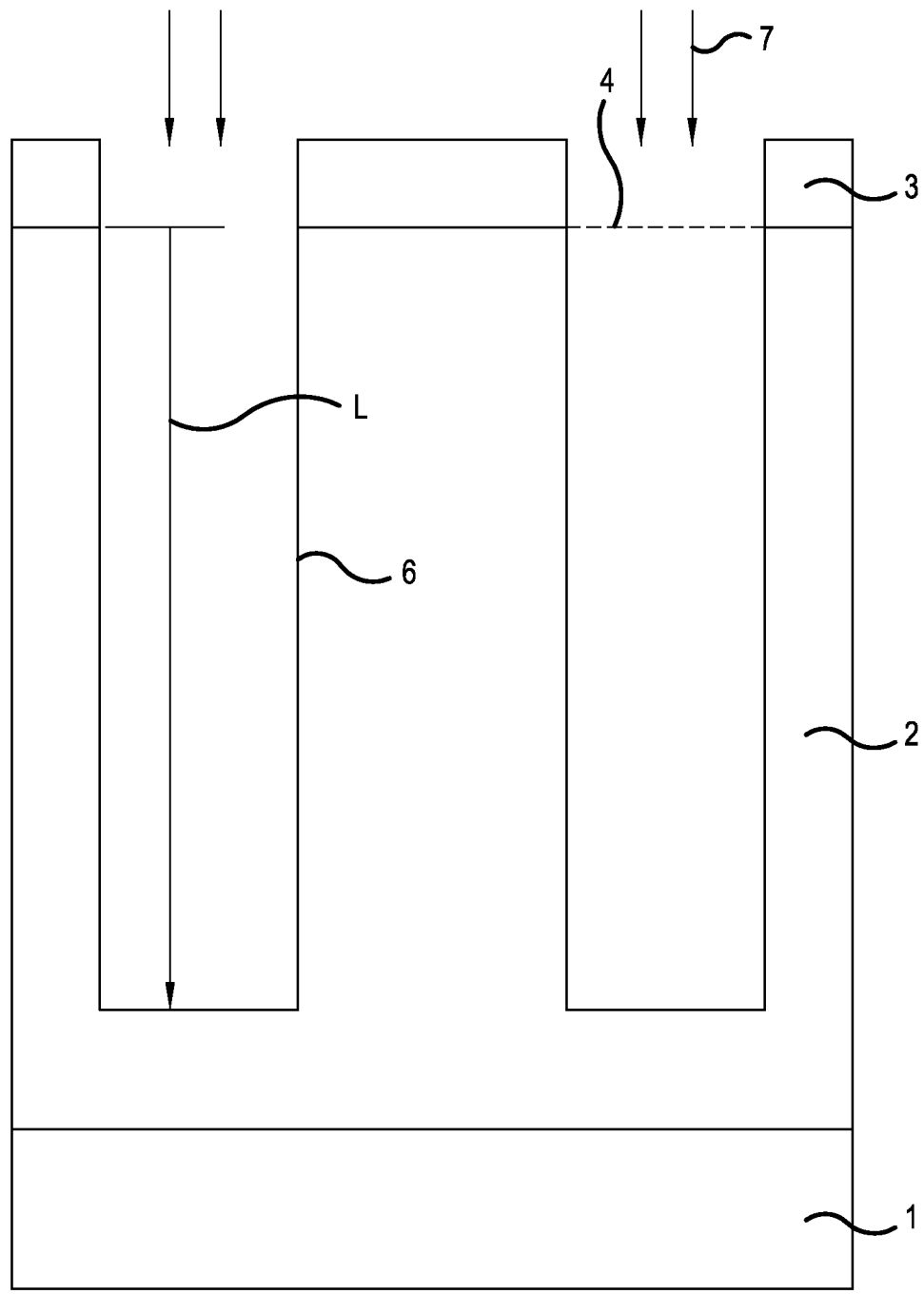
FIG. 3 is a sectional view showing an essential part of super-junction semiconductor device 100 in a step of manufacturing the device 100 according to the first embodiment of the invention following the step of FIG. 2.

(3) Then, as shown in FIG. 3, etching 7 is conducted on surface 5 (indicated in FIG. 2) exposed at openings 4 of oxide film 3 by means of a dry etching method using a mask of oxide film 3 to form trenches 6 with a depth L of about 40 μm from surface 5. N type semiconductor layer 2 in which trenches 6 are formed becomes n type columns.

Figure 4:
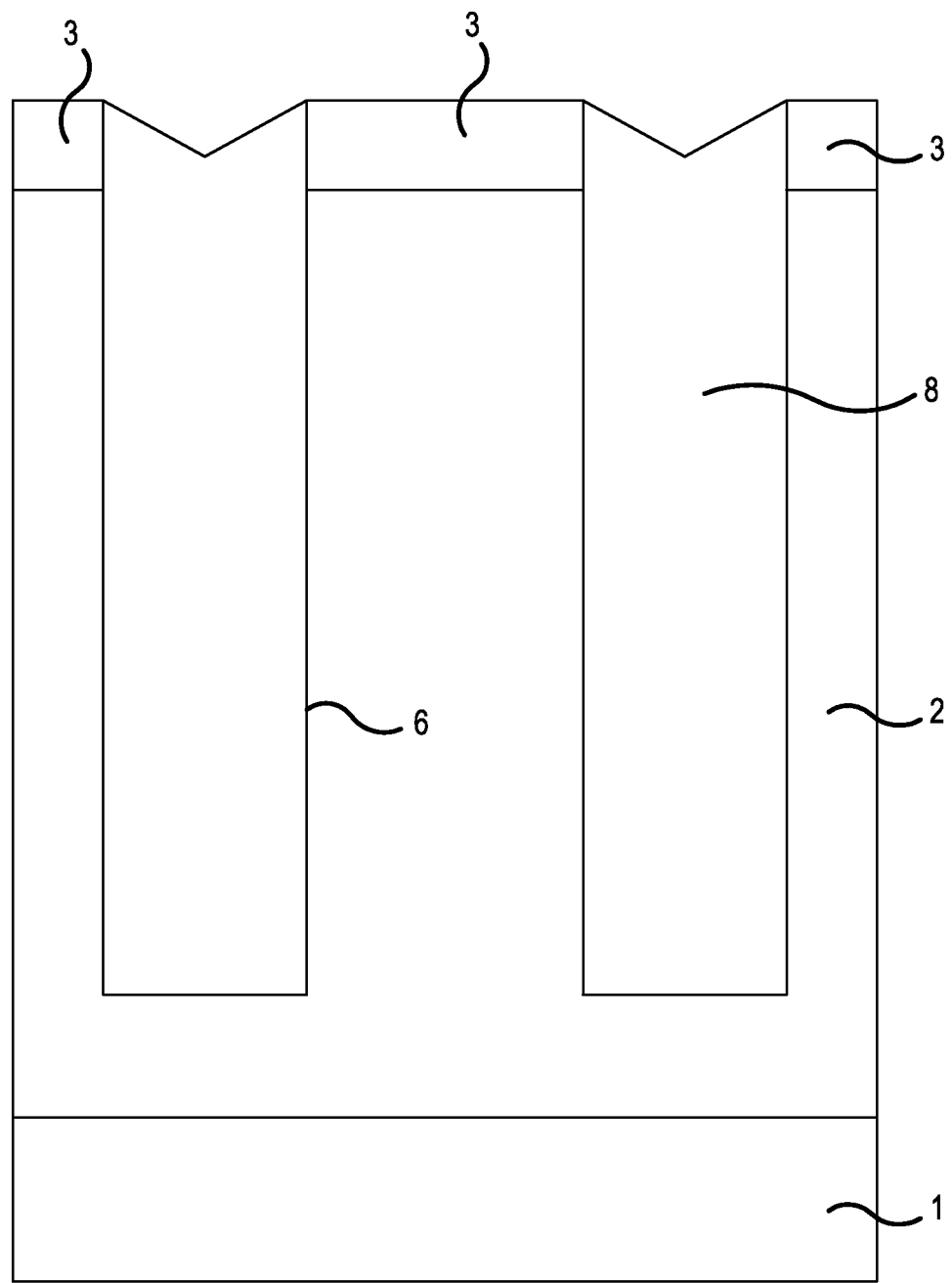
FIG. 4 is a sectional view showing an essential part of super-junction semiconductor device 100 in a step of manufacturing device 100 according to the first embodiment of the invention following the step of FIG. 3.

(4) Then, as shown in FIG. 4, the inside of trenches 6 are filled with p type semiconductor layers 8 formed by epitaxial growth to obtain p type columns.

Figure 5:
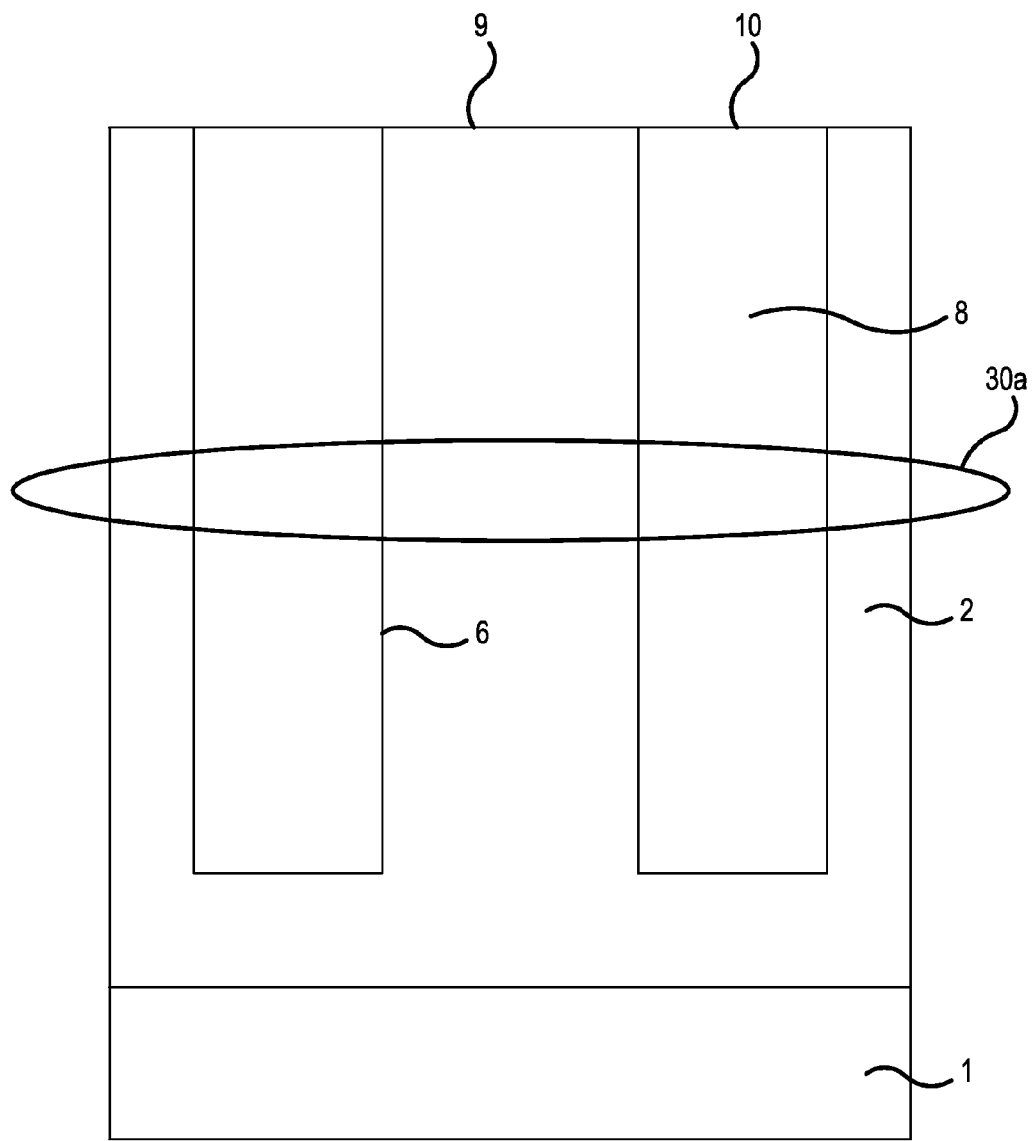
FIG. 5 is a sectional view showing an essential part of super-junction semiconductor device 100 in a step of manufacturing device 100 according to the first embodiment of the invention following the step of FIG. 4.

(5) Then, as shown in FIG. 5, oxide film 3 (shown in FIG. 4) is removed with hydrofluoric acid solution, for example, and the upper part of p type semiconductor layer 8 is eliminated by chemico-mechanical polishing (CMP) or etching to level top surface 10 of p type semiconductor layer 8, which is a p type column, with top surface 9 of n type semiconductor layer 2, which is an n type column. Thus, parallel pn layer 30a with a parallel pn column structure is formed.

Figure 6:
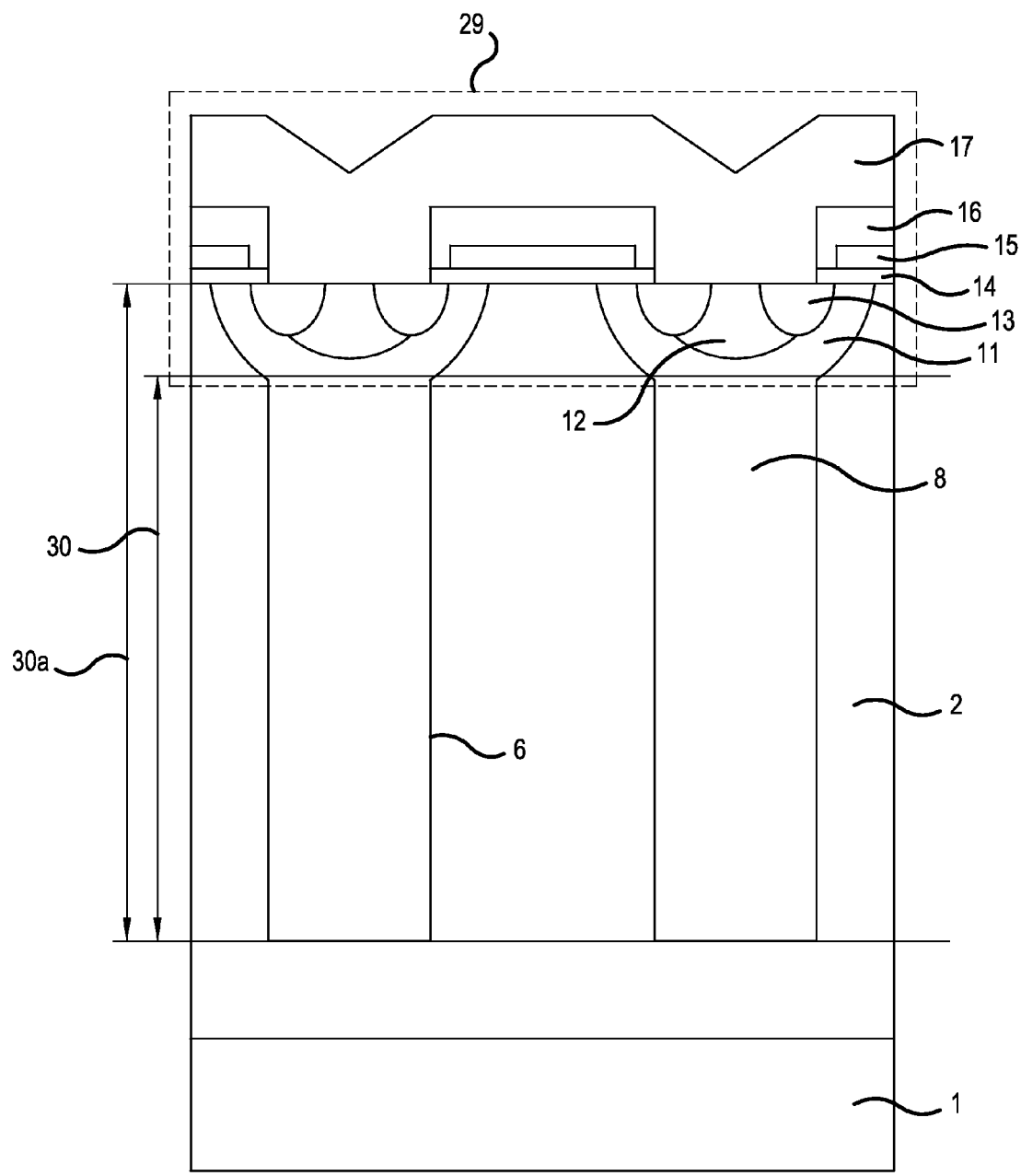
FIG. 6 is a sectional view showing an essential part of super-junction semiconductor device 100 in a step of manufacturing device 100 according to the first embodiment of the invention following the step of FIG. 5.

(6) Then, as shown in FIG. 6, device surface structure 29 is formed in the upper part of parallel pn layer 30a by the same procedure as the one for manufacturing a conventional MOSFET.

Device surface structure 29 comprises p base region 11 formed on p type semiconductor layer 8 in the surface region of the parallel pn layer, and p+ contact region 12 and $n^+$ source region 13 formed in the surface region of p base region 11. Device surface structure 29 also comprises gate electrode 15 formed, through gate oxide film 14, above the part of p base region 11 between n type semiconductor layer 2 and $n^+$ source region 13. Device surface structure 29 further comprises interlayer dielectric film 16 formed covering gate electrode 15 and source electrode 17 in contact with $p^+$ contact region 12 and $n^+$ source region 13 at the opening in interlayer dielectric film 16.

Figure 15:
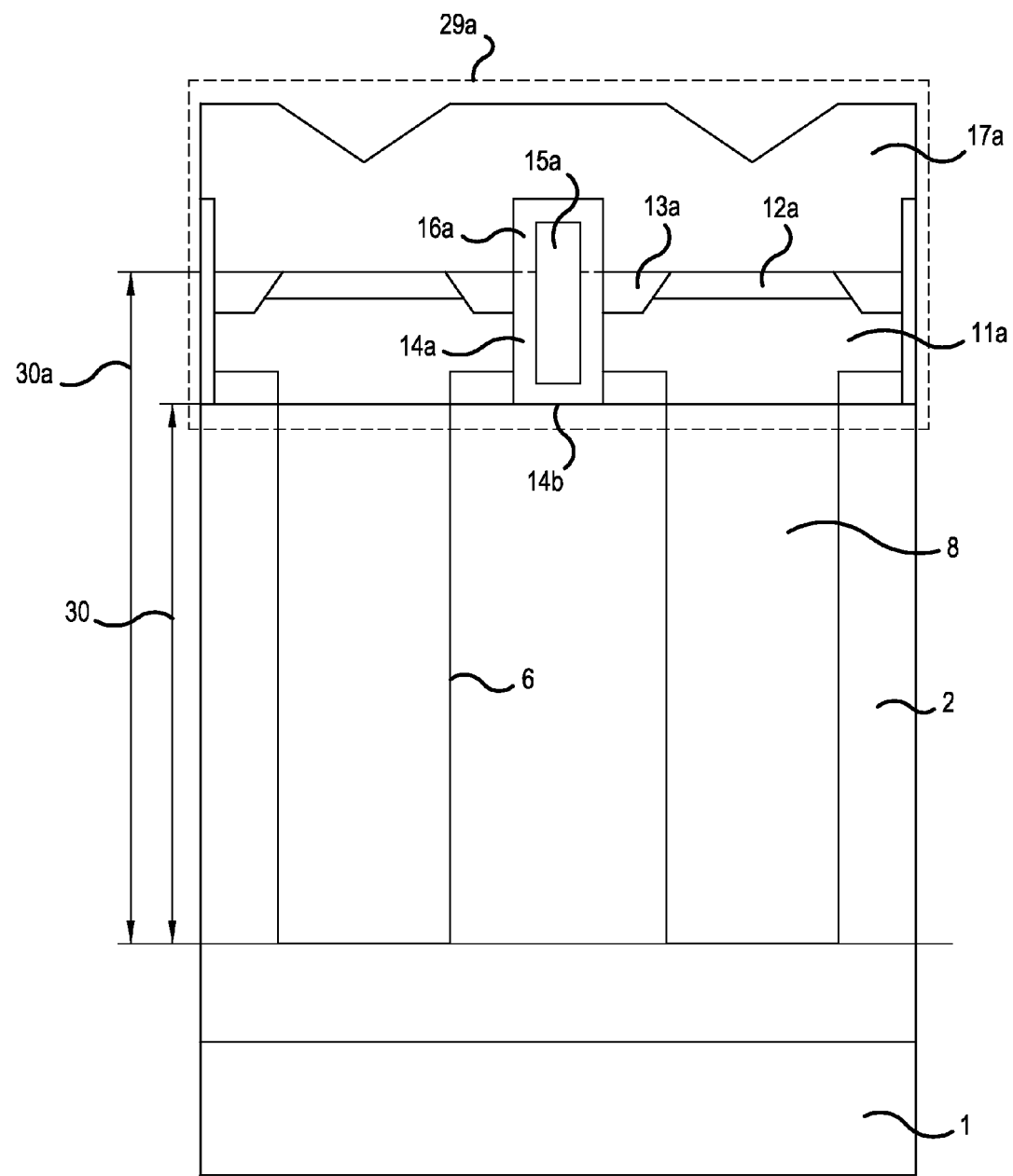
FIG. 15 is a sectional view showing essential part of a super-junction semiconductor device having device surface structure 29a of a trench gate type MOSFET in place of device surface structure 29 of the device of FIG. 6.

Device surface structure 29 has a configuration of a planar gate structure. The device surface structure can have a configuration of a trench gate structure as shown in FIG. 15. Device surface structure 29a having a configuration of a trench gate structure comprises p base region 11a formed on p type semiconductor layer 8 in the surface region of the parallel pn layer, and $p^+$ contact region 12a and $n^+$ source region 13a formed in the surface region of p base region 11a. Device surface structure 29a also comprises trench 14b extending from the top surface of p base region 11a to the top of the n type column, and gate electrode 15a formed in trench 14b through gate oxide film 14a. Device surface structure 29a further comprises interlayer dielectric film 16a formed covering gate electrode 15a and source electrode 17a in contact with $p^+$ contact region 12a and $n^+$ source region 13a at the opening in interlayer dielectric film 16a. Of parallel pn layer 30a, the portion below trench 14b, or below device surface structure 29a, is parallel pn layer 30.

Figure 7:
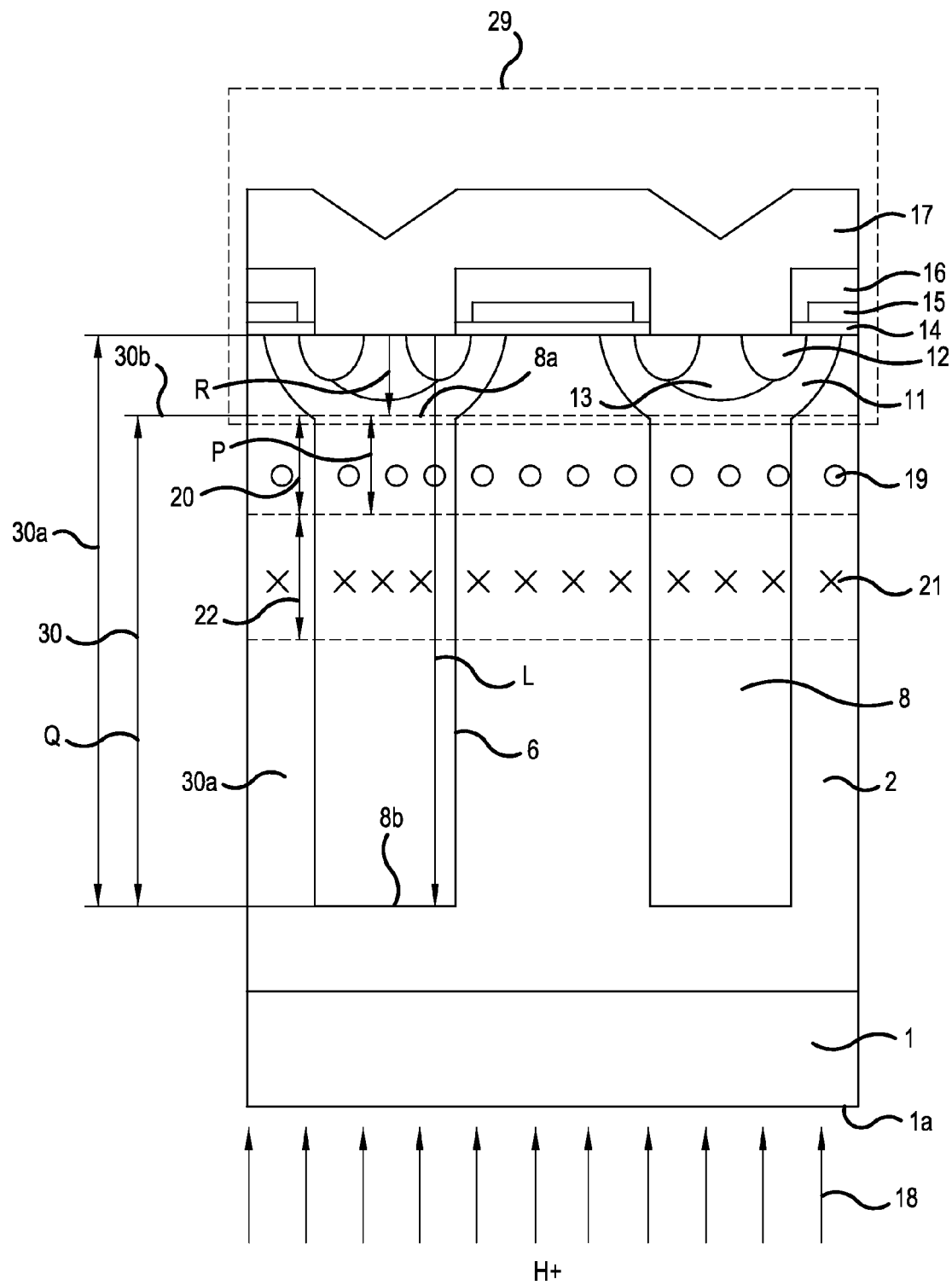
FIG. 7 is a sectional view showing an essential part of super-junction semiconductor device 100 in a step of manufacturing device 100 according to the first embodiment of the invention following the step of FIG. 6.

(7) Then, as shown in FIG. 7, the back side of n type semiconductor substrate 1 is ground and polished to reduce the total thickness to a range of about 60 μm to 80 μm. This thickness varies depending on the withstand voltage of the semiconductor device. Proton irradiation 18 is conducted from the side of back surface 1a of n type semiconductor substrate 1 after the grinding and polishing, in which protons 19 at an energy of about 0.5 MeV are driven into parallel pn layer 30 at the position beneath p base region 11, i.e., beneath device surface structure 29, thereby forming proton irradiation layer 20. In front of the region that contains irradiated protons 19, defective layer 22 including lattice defects 21 extends.

In the case of device surface structure 29a having the trench gate structure as shown in FIG. 15, the irradiated protons may reach gate oxide film 14a, which is unfavorable for long term stability. Accordingly, it is desired to adjust the irradiation energy by setting emission energy or by using a moderator material so that the top position of proton irradiation layer 20 is below the bottom of oxide film 14a. In the case of device surface structure 29 having a planar gate structure as shown in FIG. 7, protons 19 are allowed to reach p base region 11 as long as the threshold voltage or long-term reliability is not affected.

Figure 8:
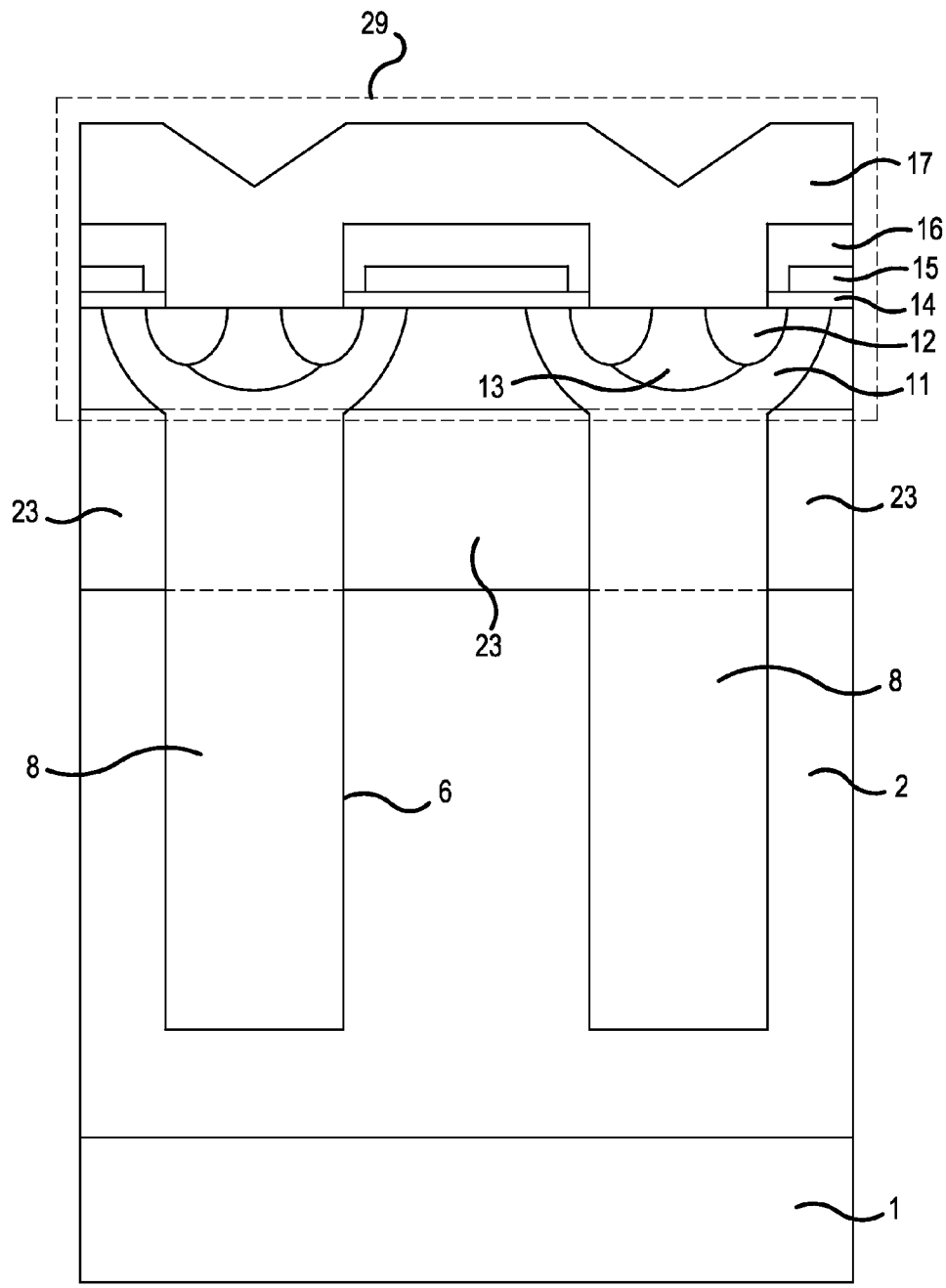
FIG. 8 is a sectional view showing an essential part of super-junction semiconductor device 100 in a step of manufacturing device 100 according to the first embodiment of the invention following the step of FIG. 7.

(8) Then, as shown in FIG. 8, after proton irradiation, a heat treatment process is conducted at a temperature in the range of 350° C. to 450° C., which recovers defective layer 22 and transforms protons 19 into donors to form high concentration n type semiconductor region 23, i.e., a donorized proton region. The impurity levels created in the irradiation layer with protons 19 or other heavy particles are transformed to donors in the heat treatment process. The donorization process is related to oxygen and lattice defects produced by the irradiation.

Figure 9:
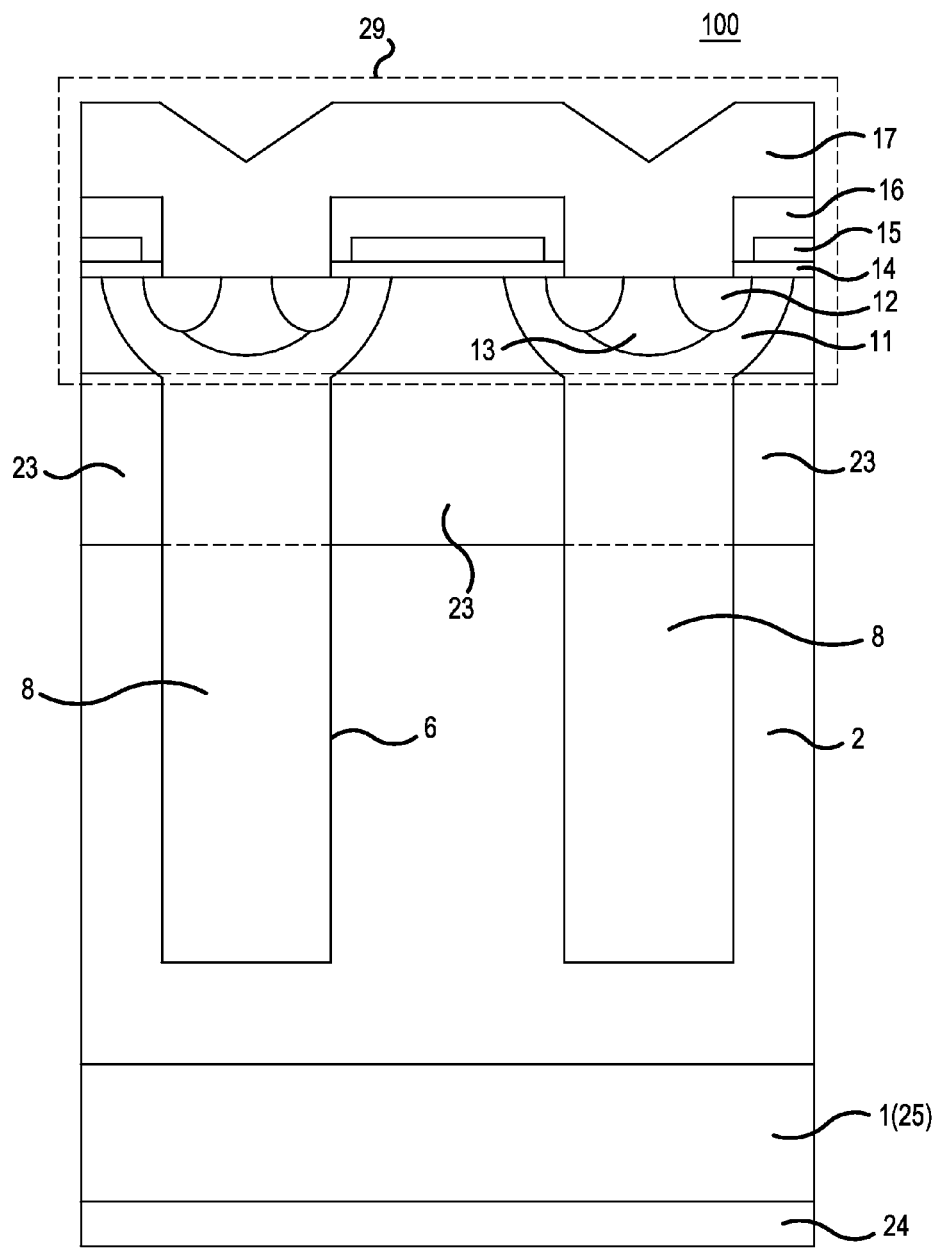
FIG. 9 is a sectional view showing an essential part of super-junction semiconductor device 100 in a step of manufacturing device 100 according to the first embodiment of the invention following the step of FIG. 8.

(9) Finally, as shown in FIG. 9, on n+ drain region 25, which is n+ type semiconductor substrate 1 after made thin, in the back surface side, drain electrode 24 is formed by an evaporation or a sputtering process. Thus, super-junction semiconductor device 100 is completed.

The method of manufacturing super-junction semiconductor device 100 as described above eliminates repeat of multiple times of series of steps of from the step (1) of epitaxial growth through the step (4) of ion implantation as in the conventional multi-stage epitaxial growth method, and achieves reduction in production steps and manufacturing costs. The method also improves the trade-off relationship between Eoff and dV/dt in the case of varied gate resistance, which has been a problem in the device manufactured by the trench embedding method. Therefore, the method can manufacture super-junction semiconductor device 100 that improves the tradeoff relationship between Eoff and dV/dt at a low cost.

Parameters in the process of proton irradiation 18, which depend on the equipment, need to be adjusted for the actual equipment. It is supposed that parallel pn layer 30 is defined, as shown in FIG. 7, from position 8a of contact between p type semiconductor layer 8 and p type base region 11, position 8a being the bottom of device surface structure 29, to lower end 8b of p type semiconductor layer 8, position 8b being the bottom surface of parallel pn layer 30 and 30a. Then the length Q in the depth direction of parallel pn layer 30 is a value of the depth L of trench 6 subtracted by a depth R of the position of contact between p type base region 11 and p type semiconductor layer 8. In the case of L=40 μm and R=8 μm, then Q=32 μm. Then proton irradiation layer 20 is preferably formed in a region from surface 30b of parallel pn layer 30, surface 30b being at position 8a, to a position at most a half (16 μm) of the length Q of parallel pn layer 30, more preferably a position at most a quarter (8 μm) of the length Q of parallel pn layer 30. Proton irradiation layer 20 forms high concentration n type semiconductor region 23 by a subsequent heat treatment process. High concentration n type semiconductor region 23 provides a favorable charge balance and avoids degradation of a withstand voltage.

The impurity concentration of high concentration n type semiconductor region 23 is adjusted by proton dose amount; the position of high concentration n type semiconductor region 23 is adjusted by the irradiation energy of the protons; and the thickness of high concentration n type semiconductor region 23 is adjusted by conducting multiple times of proton irradiation changing the irradiation energy.

The proton dose amount is preferably adjusted so that the mean donor concentration due to the protons is 0.1 to 2.0 times the impurity concentration of n type semiconductor layer 2. This means that the impurity concentration of high concentration n type semiconductor region 23 is preferably raised to 1.1 (1.0+0.1) times to 3.0 (1.0+2.0) times that of n type semiconductor layer 2. This measure achieves favorable charge balance and avoids deterioration of the withstand voltage of parallel pn layer 30. In addition, the tradeoff relationship between Eoff and dV/dt also is improved.

The semiconductor device of Embodiment Example 1 is designed with a withstand voltage of 600 V, a width W of the opening 4 of 6 μm and a cell pitch of 12 μm, and the impurity concentration, the as-formed original doping concentration, of the n type semiconductor layer 2 of $5.0 \times 10^{15}$ cm$^{-3}$. As described above, the mean donor concentration due to protons is preferably 0.1 to 2.0 times the impurity concentration of n type semiconductor layer 2, i.e., from $0.5 \times 10^{15}$ cm$^{-3}$ to $1.0 \times 10^{16}$ cm$^{-3}$. This means that the impurity concentration of high concentration n type semiconductor region 23 is preferably in the range from $5.5 \times 10^{15}$ cm$^{-3}$ to $1.5 \times 10^{16}$ cm$^{-3}$. The mean donor concentration is determined at such a value that does not reverse the conductivity of p type semiconductor layer 8, or does not change to the n type. A mean donor concentration less than 0.1 times the impurity concentration of n type semiconductor layer 2 results in too low impurity concentration in high concentration n type semiconductor region 23 to obtain satisfactory improvement in the tradeoff relationship between Eoff and dV/dt. On the contrary, a donor concentration higher than 2.0 times disturbs the charge balance in parallel pn layer 30 and lowers the withstand voltage. A high concentration n type semiconductor region 23 is formed by adding the mean donor concentration due to the protons to the impurity concentration of the original n type semiconductor layer 2. In the case of parallel pn layer 30 having a length Q of about 32 μm as described previously, the part of a quarter of this length, which is a part of a length of 8 μm from the top of parallel pn layer 30, or from the bottom of p base region 11, is made to contain the mean donor concentration due to the protons in the range from $0.5 \times 10^{15}$ cm$^{-3}$ to $1.0 \times 10^{16}$ cm$^{-3}$. Such a high concentration n type semiconductor region 23 avoids deterioration of a withstand voltage and remarkably improves the tradeoff relationship between Eoff and dV/dt. The quarter in the above can be changed to a half still exhibiting improvement in the tradeoff relationship.

Figure 11:
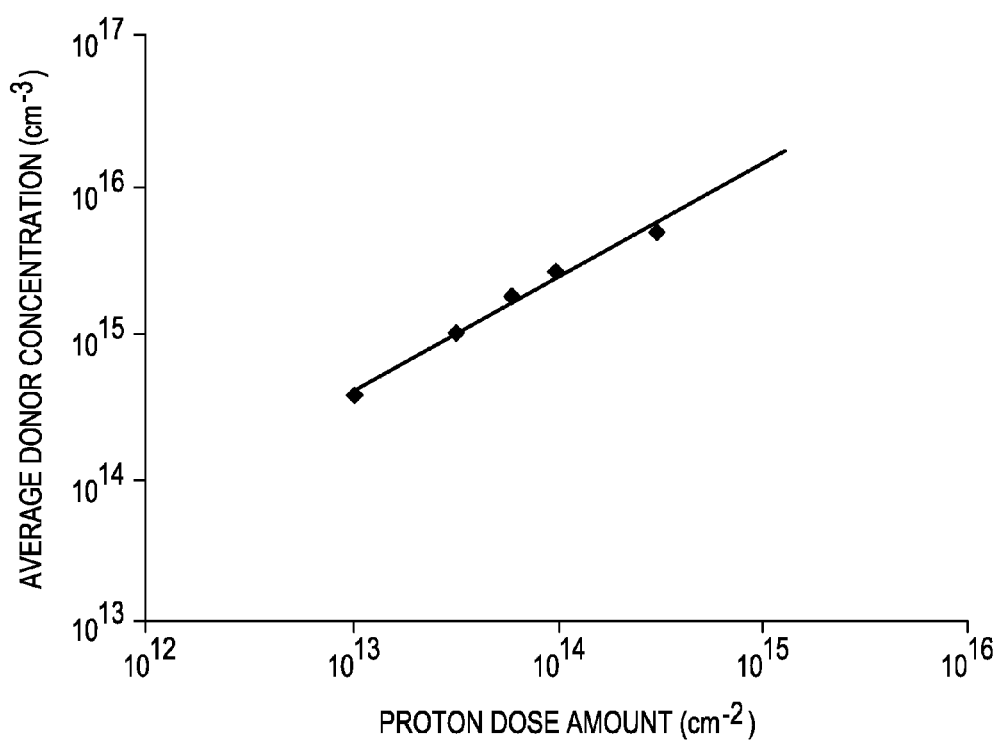
FIG. 11 shows a relationship between a mean donor concentration obtained by proton irradiation and dose amount of the protons.

FIG. 11 is a graph showing a relationship between a mean donor concentration due to protons (cm$^{-3}$) and a dose amount of protons (cm$^{-2}$). The protons are distributed in the range of proton irradiation layer 20, which is from top surface 30b of parallel pn layer 30 to the position of 8 μm below top surface 30b. High concentration n type semiconductor region 23 is preferably formed in this range. The mean donor concentration due to protons was obtained from a diffusion profile of the donor concentration in the depth direction, which was measured by secondary ion mass spectroscopy (SIMS).

The graph of FIG. 11 shows data under the conditions of: a proton energy of 0.5 MeV, an annealing temperature of 350° C., and an annealing time of 5 hours. The mean donor concentration due to protons as shown above, which is from $0.5 \times 10^{15}$ cm$^{-3}$ to $1.0 \times 10^{16}$ cm$^{-3}$, is obtained by a proton dose amount in the range of $1.0 \times 10^{13}$ cm$^{-2}$ to $0.9 \times 10^{15}$ cm$^{-2}$ according to the graph of FIG. 11.

In order to change the impurity concentration and a thickness of high concentration n type semiconductor region 23, it is needed to adjust the conditions of proton irradiation energy and annealing temperature and time. Thus, a concentration profile of donors due to protons needs to be newly obtained for varied proton dose amounts by means of SIMS, for example, to produce a graph like FIG. 11.

Another method for obtaining a similar construction forms a high concentration n type semiconductor region by an epitaxial growth method. A method is known for forming a high concentration n type semiconductor region with an enhanced n type concentration by epitaxial growth in the process of forming n type semiconductor layer 2a on an n type semiconductor substrate 1 of silicon in the step of FIG. 1 described earlier. This method, however, has a difficulty in achieving a homogeneous concentration by the epitaxial growth method. A high concentration n type semiconductor region formed by this method exhibits dispersion in impurity concentration of at least ±10%. In contrast, the proton irradiation process restrains the scattering of impurity concentration within ±5% and enhances the precision of impurity concentration as compared with the epitaxial growth process. Higher precision allows limiting design and downsizing of a super-junction semiconductor device. The higher precision also enhances a rate of non-defective products thereby reducing manufacturing costs.

High concentration n type semiconductor region 23 formed in the range within half, preferably quarter, of the length Q of parallel pn layer 30 avoids deterioration of the withstand voltage and improves the tradeoff relationship between Eoff and dV/dt.

Embodiment Example 2

Figure 12:
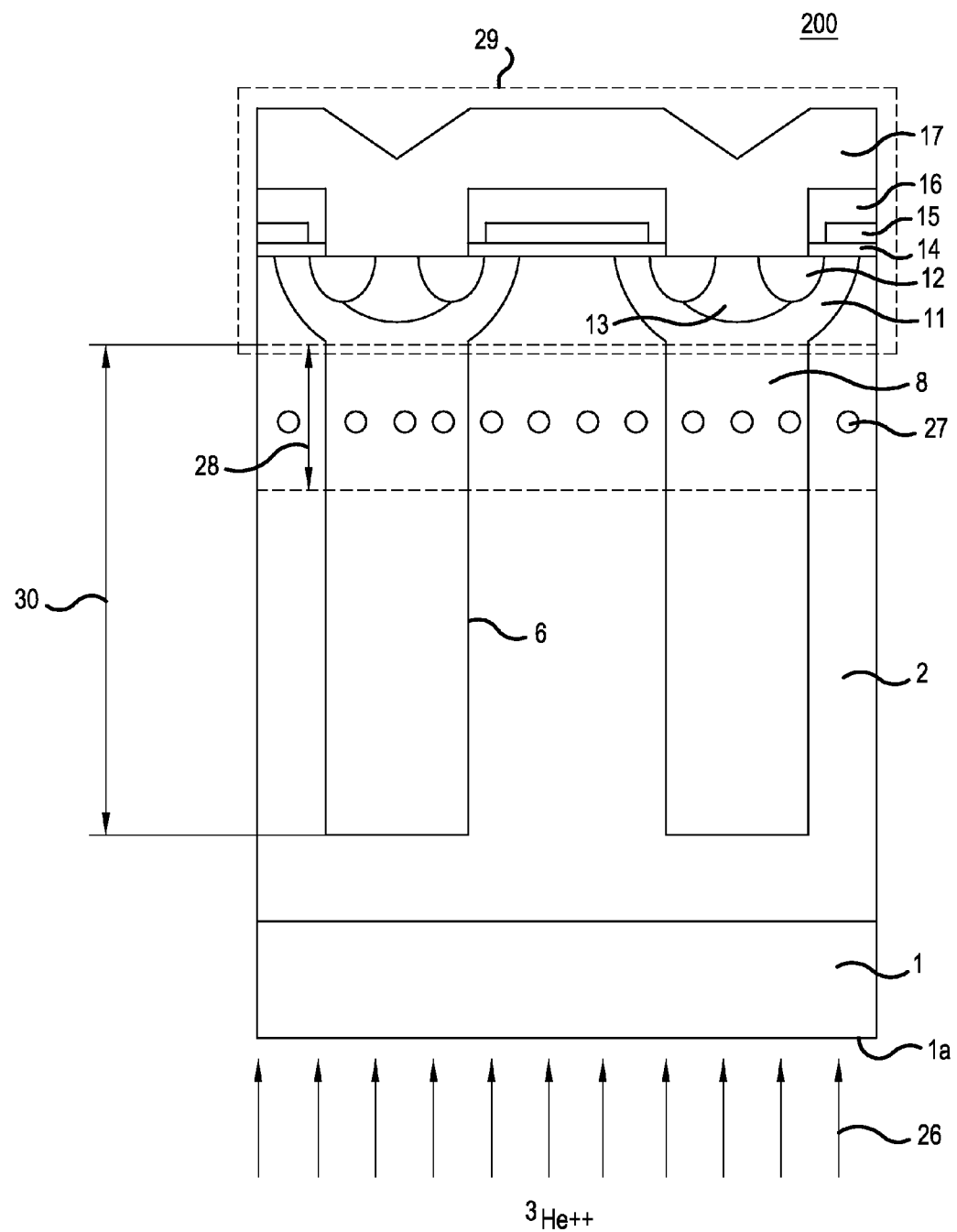
FIG. 12 is a sectional view showing an essential part of super-junction semiconductor device 200 in a step of manufacturing device 200 according to a second embodiment of the invention.
Figure 13A:
FIGS. 13A through 13F are sectional views showing essential parts of a super-junction semiconductor device in steps of a conventional method of manufacturing the device using a multi-stage epitaxial growth method.
Figure 13B:
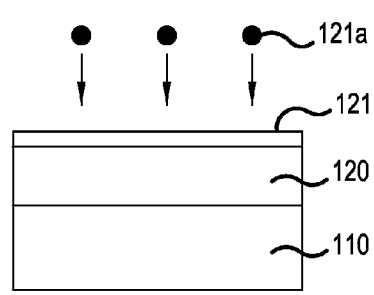
Figure 13C:
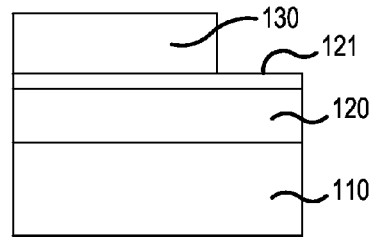
Figure 13D:
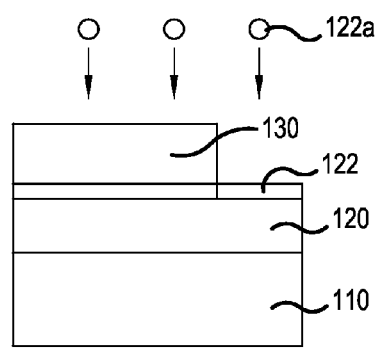
Figure 13E:
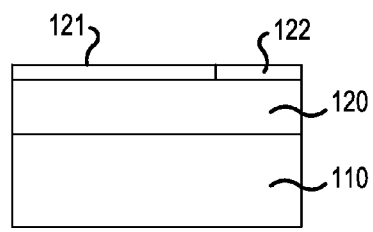
Figure 13F:
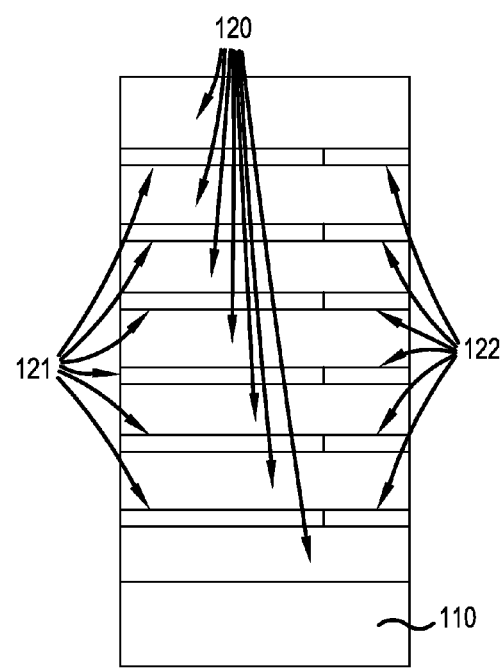
Figure 14G:
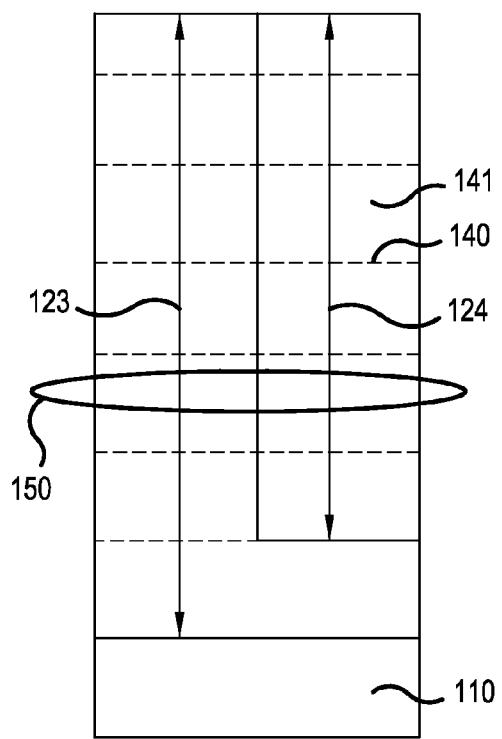
FIGS. 14G and 14H are sectional views showing essential parts of a super-junction semiconductor device in steps following the steps of FIG. 13F of a conventional method of manufacturing the device using a multi-stage epitaxial growth method.
Figure 14H:
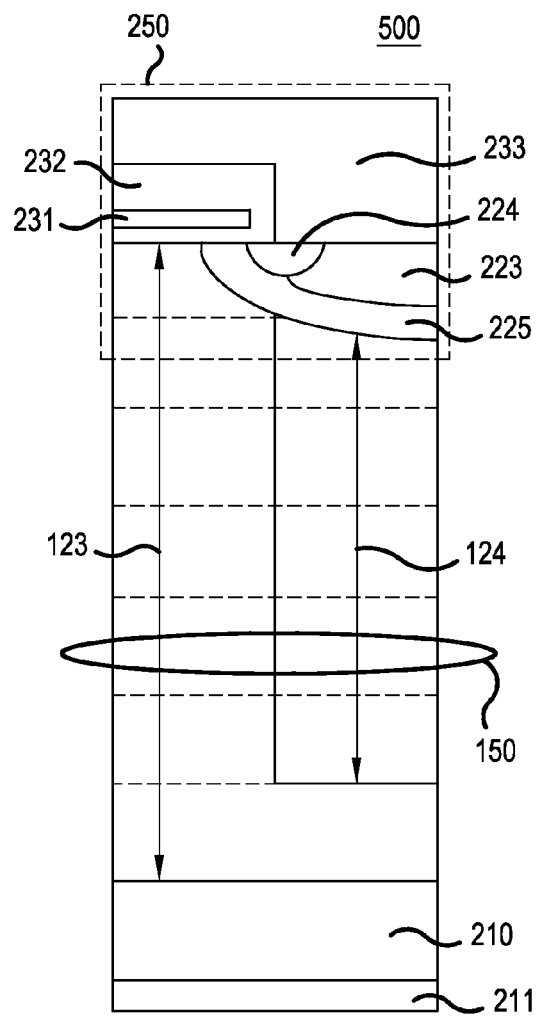

FIG. 12 is a sectional view showing an essential part of a super-junction semiconductor device 200 in a step of manufacturing the device 200 according to a second embodiment of the invention. This drawing corresponds to FIG. 7 in Embodiment Example 1. This Embodiment Example 2 differs from Embodiment Example 1 in that Embodiment Example 2 uses irradiation particles of helium ions 27, i.e., $^3He^{++}$ and $^4He^{++}$ in place of protons 18. In the case of helium ions 27, a temperature necessary for donorization is about 500° C. and higher than in the case of protons 18. Consequently, damage to a an electrode is a concern. In order to cope with this problem, the particle irradiation and subsequent heat treatment are favorably carried out before forming the drain electrode and the source electrode.

The helium ion irradiation has similar effects as the proton irradiation. FIG. 12 indicates helium ion irradiation 26 and helium ion irradiation layer 28.

Embodiment Example 3

Figure 16:
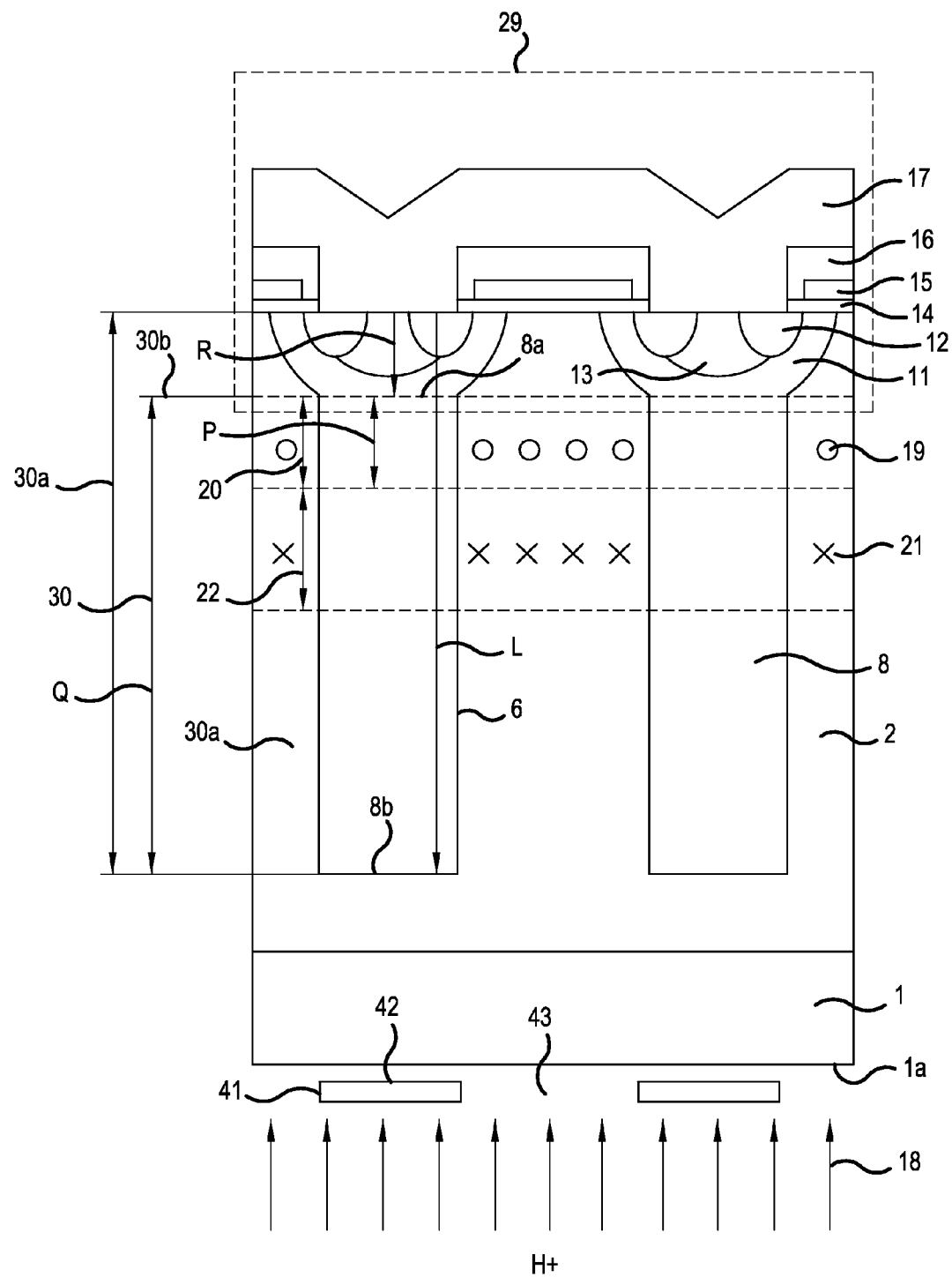
FIG. 16 is a sectional view showing an essential part of super-junction semiconductor device 300 corresponding to the device of FIG. 7 in a step of manufacturing device 300 according to a third embodiment of the invention.
Figure 17:
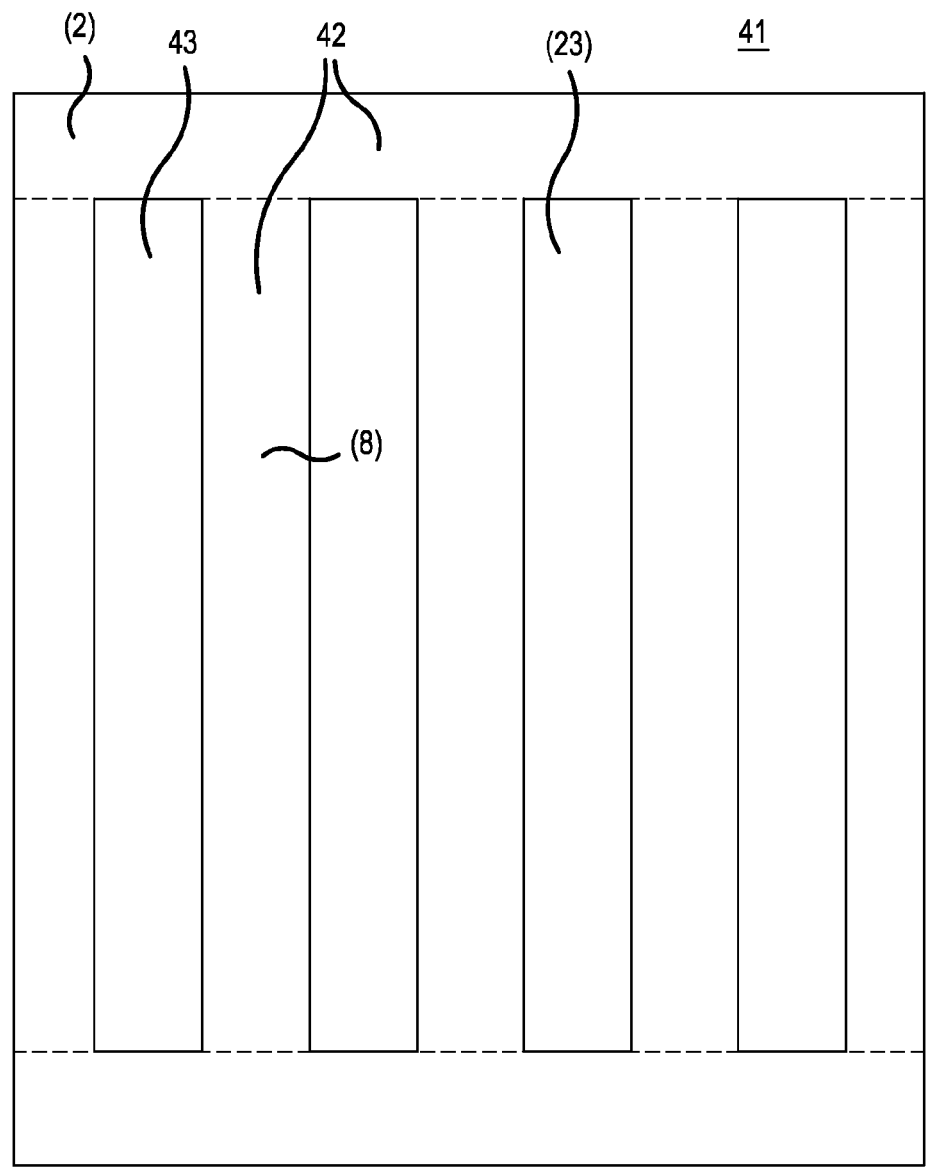
FIG. 17 is a plan view showing an essential part of a shielding mask used for manufacturing the device of FIG. 16.

FIG. 16 and FIG. 17 illustrate a method of manufacturing a super-junction semiconductor device 300 according to the third embodiment of the present invention, in which FIG. 16 is a sectional view of an essential part of the device in a manufacturing step corresponding to FIG. 7 in Embodiment Example 1 and FIG. 17 is a plan view of a shielding mask used in the step of forming the structure of FIG. 16.

N type semiconductor layer 2 is subjected to proton irradiation, but p type semiconductor layer 8 is prevented from irradiation using shielding mask 41 made of aluminum. The shielding mask is not limited to aluminum but chromium, gold, or other materials that can shield the irradiating ions can be used.

Because p type semiconductor layer 8 is not irradiated by protons, the p type impurity concentration does not decrease, which improves charge balance as compared with the case of Embodiment Example 1. Thus, a necessary withstand voltage is readily secured and the n type impurity concentration in n type semiconductor layer 2 can be raised.

FIG. 17 indicates shielding part 42 of shielding mask 41 and openings 43 of shielding mask 41. Shielding part 42 is disposed on p type semiconductor layer 8 of parallel pn layer 30 and openings 43 are disposed on n type semiconductor layer 2 of parallel pn layer 30.

The shielding mask also shields an edge termination region of the device, preventing increase of the donors in the edge termination region, thereby avoiding deterioration of the withstand voltage.

Although shielding mask 41 is used for shielding p type semiconductor layer 8 from proton irradiation, a shielding mask is used for solely shielding the egde termination region of the device.

Embodiment Example 4

Figure 18:
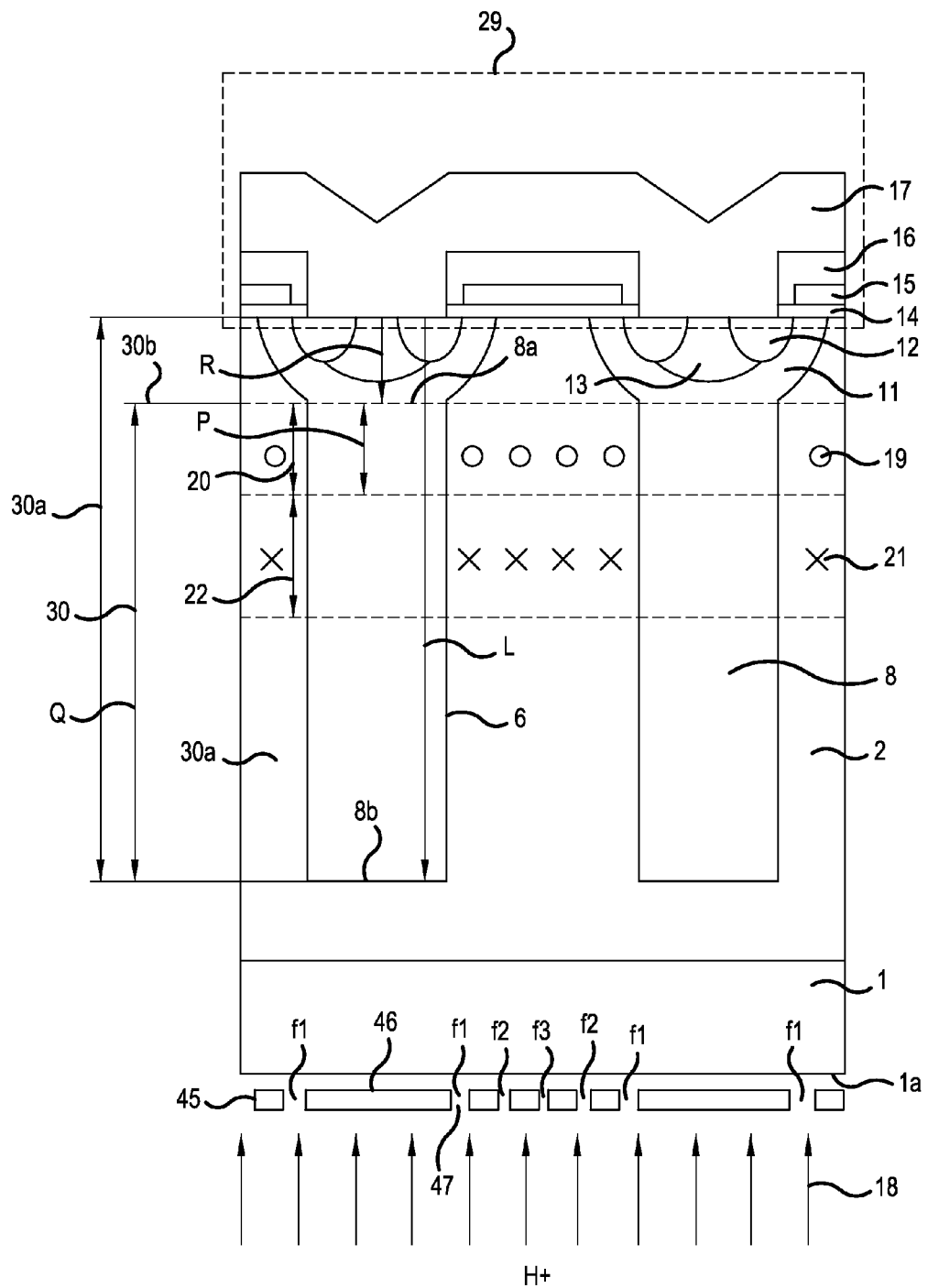
FIG. 18 is a sectional view showing an essential part of super-junction semiconductor device 400 corresponding to the device of FIG. 7 in a step of manufacturing device 400 according to a fourth embodiment of the invention.

FIG. 18, FIG. 19A, and FIG. 19B show a method of manufacturing a super-junction semiconductor device 400 according to Embodiment Example 4 of the present invention, in which FIG. 18 is a sectional view showing an essential part of super-junction semiconductor device 400 corresponding to the device of FIG. 7 in a step of manufacturing device 400, FIG. 19A is a plan view showing an essential part of shielding mask 45, and FIG. 19B is a graph showing donor distribution along the line X-X in FIG. 19A.

Shielding mask 45 has openings 47 with a diameter, or an area, that decreases along the direction from the boundary between p type semiconductor layer 8 and n type semiconductor layer 2 of the parallel pn layer, toward the center of n type semiconductor layer 2. Shielding mask 45 makes the donor concentration in n type semiconductor layer 2 at the vicinity of the boundary with p type semiconductor layer 8 relatively high, and decreases gradually the donor concentration toward the center of n type semiconductor layer 2. High concentration n type semiconductor region 23 (such as shown in FIG. 9) is formed having this distribution of impurity concentration. Mask 45 has an opening 'f1' with a large diameter, an opening 'f2' with a middle diameter, and an opening 'f3' with a small diameter. Although openings 47 in this embodiment are three types of different sizes, they are not limited to these three types. In addition, openings 47 do not necessarily have a planar shape of a circle, but can have a shape of a triangle, a square, a polygon, or a stripe. In any case, shielding mask 45 necessarily has openings 47, the area of which gradually decreases toward the center of n type semiconductor layer 2. The central part of n type semiconductor layer 2 can be free of opening. In that case, high concentration n type semiconductor region 23 is not formed in the central part of n type semiconductor layer 2.

High concentration n type semiconductor region 23 formed using shielding mask 45 have relatively high concentration around the pn junction at the boundary with p type semiconductor layer 8 as compared with uniform proton irradiation under the condition of the same total amount of impurities. As a result, the depletion layer extending from the pn junction at the boundary with p type semiconductor layer 8 into high concentration n type semiconductor region 23 is suppressed in extension of depletion layer in the initial stage. As a consequence, the dV/dt at turning OFF decreases as compared with Embodiment Example 1 and thus electromagnetic noise decreases, too. FIG. 18 indicates shielding part 46 of shielding mask 45.

Embodiment Examples 3 and 4 can use helium ion irradiation as Embodiment Example 2 in place of proton irradiation.

Thus, a method of manufacturing a super-junction semiconductor device has been described according to the present invention. Many modifications and variations may be made to the techniques and devices described and illustrated herein without departing from the spirit and scope of the invention. Accordingly, it should be understood that the methods described herein are illustrative only and are not limiting upon the scope of the invention.

DESCRIPTION OF SYMBOLS

1: n type semiconductor substrate, which becomes a drain region
1a: back surface
2: n type semiconductor layer, which is an n type column
2a: n type semiconductor layer, which is an epitaxial layer before forming a trench
3: oxide film
4, 43, 47: opening
5: surface of the epitaxial layer
6: trench 7: etching
8: p type semiconductor layer, which is a p type column
9: top surface of an n type column
10: top surface of a p type column
11, 11a: p base region
12, 12a: p+ contact region
13, 13a: n+ source region
14, 14a: gate oxide film
14b: trench
15, 15a: gate electrode
16, 16a: inter-layer dielectric film
17, 17a: source electrode
18: proton irradiation
19: proton
20: proton irradiation layer
21: crystal lattice defect
22: defective layer
23: high concentration n type semiconductor region
24: drain electrode
25: n+ drain region
26: helium ion irradiation
27: helium ion
28: helium ion irradiation layer
29: device surface structure of a planar gate type
29a: device surface structure of a trench gate type
30: parallel pn layer beneath the device surface structure 29
30a: parallel pn layer before forming the device surface structure 29
41, 45: shielding mask
42, 46: shielding part
100, 200: super-junction semiconductor device of the invention

What is claimed is:

1. A method of manufacturing a super-junction semiconductor device comprising steps of:
   forming a first semiconductor layer of a first conductivity type on a semiconductor substrate by means of an epitaxial growth process, wherein the first semiconductor layer has a lower concentration of impurities than the substrate;
   forming a trench in the first semiconductor layer from a surface of the first semiconductor layer toward the semiconductor substrate;
   forming a parallel pn layer of a super-junction structure by filling the trench with an epitaxially grown second semiconductor layer of a second conductivity type;
   forming a device surface structure on the surface region of the parallel pn layer;
   decreasing a thickness of the semiconductor substrate by grinding a back side of the semiconductor substrate after the step of forming the device surface structure;
   forming a heavy particle irradiation layer by irradiating heavy particles from the back side of the semiconductor substrate into a portion of the parallel pn layer beneath the device surface structure after the step of decreasing the thickness of the semiconductor substrate; and
   forming a third semiconductor layer of the first conductivity type with an impurity concentration lower than that of the second semiconductor layer and higher than that of the first semiconductor layer by transforming the heavy particles in the heavy particle irradiation layer formed by the heavy particle irradiation into donors through a heat treatment process, wherein, the third semiconductor layer is adjacent to the device surface structure.

2. The method of manufacturing a super-junction semiconductor device according to claim 1, wherein the heavy particle irradiation layer is disposed under the device surface structure in the range of at most a half of the distance from a bottom of the device surface structure to a bottom of the parallel pn layer.

3. The method of manufacturing a super-junction semiconductor device according to claim 2, wherein the heavy particle irradiation layer is disposed under the device surface structure in the range of at most a quarter of the distance from a bottom of the device surface structure to a bottom of the parallel pn layer.

4. The method of manufacturing a super-junction semiconductor device according to claim 1, wherein a mean donor concentration of donors that are transformed from the heavy particles in the heavy particle irradiation layer through the heat treatment process is in the range of 0.1 times to 2 times the impurity concentration of the first semiconductor layer.

5. The method of manufacturing a super-junction semiconductor device according to claim 1, wherein the heavy particle irradiation layer is formed by conducting multiple irradiations of heavy particles at different acceleration energies.

6. The method of manufacturing a super-junction semiconductor device according to claim 1, wherein the step of forming the device surface structure comprises steps of:
   forming a fourth semiconductor layer of the second conductivity type in contact with the second semiconductor layer;
   forming a fifth semiconductor layer of the first conductivity type in a surface region of the fourth semiconductor layer; and
   forming a gate electrode through a gate insulation film over the fourth semiconductor layer between the fifth semiconductor layer and the first semiconductor layer.

7. The method of manufacturing a super-junction semiconductor device according to claim 1, wherein, in the step of forming a heavy particle irradiation layer by irradiating heavy particles from the back side of the semiconductor substrate with a decreased thickness into a portion of the parallel pn layer beneath the device surface structure, the heavy particle irradiation is conducted by disposing a shielding part of a shielding mask on the second semiconductor layer of the parallel pn layer and disposing openings of the shielding mask on the first semiconductor layer of the parallel pn layer.

8. The method of manufacturing a super-junction semiconductor device according to claim 7, wherein the shielding mask extends onto the first semiconductor layer of the parallel pn layer; a shielding part of the shielding mask is disposed on the second semiconductor layer; and a plurality of openings of the shielding mask are disposed on the first semiconductor layer of the parallel pn layer, the magnitude of the openings gradually decreasing along a direction toward a center of the first semiconductor layer.

9. The method of manufacturing a super-junction semiconductor device according to claim 1, wherein the heavy particle is a proton or a helium ion.

10. The method of manufacturing a super-junction semiconductor device according to claim 1, wherein the super-junction semiconductor device is a super-junction MOSFET.

11. A method of manufacturing a super-junction semiconductor device comprising steps of:
   forming a first semiconductor layer of a first conductivity type on a semiconductor substrate by means of an epitaxial growth process, wherein the first semiconductor layer has a lower concentration of impurities than the substrate;
   forming a trench in the first semiconductor layer from a surface of the first semiconductor layer toward the semiconductor substrate;

forming a parallel pn layer of a super-junction structure by filling the trench with an epitaxially grown second semiconductor layer of a second conductivity type;

forming a device surface structure on the surface region of the parallel pn layer;

decreasing a thickness of the semiconductor substrate by grinding a back side of the semiconductor substrate after the step of forming the device surface structure;

forming a heavy particle irradiation layer by irradiating heavy particles from the back side of the semiconductor substrate into a portion of the parallel pn layer beneath the device surface structure after the step of decreasing the thickness of the semiconductor substrate; and forming a third semiconductor layer of the first conductivity type with an impurity concentration lower than that of the second semiconductor layer and higher than that of the first semiconductor layer by transforming the heavy particles in the heavy particle irradiation layer formed by the heavy particle irradiation into donors through a heat treatment process, wherein there is a defective layer including lattice defects beneath the third semiconductor layer and within the parallel pn layer.

12. A method of manufacturing a super-junction semiconductor device comprising steps of:

forming a first semiconductor layer of a first conductivity type on a semiconductor substrate by means of an epitaxial growth process, wherein the first semiconductor layer has a lower concentration of impurities than the substrate;

forming a parallel pn layer of a super-junction structure in the first semiconductor layer;

forming a device surface structure on the surface region of the parallel pn layer;

forming a heavy particle irradiation layer by irradiating heavy particles from the back side of the semiconductor substrate into a portion of the parallel pn layer beneath the device surface structure; and forming a third semiconductor layer of the first conductivity type with an impurity concentration lower than that of the second semiconductor layer and higher than that of the first semiconductor layer by transforming the heavy particles in the heavy particle irradiation layer formed by the heavy particle irradiation into donors through a heat treatment process, wherein, the third semiconductor layer is adjacent to the device surface structure, wherein the heavy particle irradiation layer is disposed under the device surface structure in the range of at most a half of the distance from a bottom of the device surface structure to a bottom of the parallel pn layer.

* * * * *